United States Patent
Shin et al.

(10) Patent No.: US 12,557,500 B2
(45) Date of Patent: Feb. 17, 2026

(54) DISPLAY DEVICE AND METHOD OF MANUFACTURING THE SAME

(71) Applicant: Samsung Display Co., LTD., Yongin-si (KR)

(72) Inventors: Hyun Eok Shin, Yongin-si (KR); Joon Yong Park, Yongin-si (KR); Joon Woo Bae, Yongin-si (KR); Do Keun Song, Yongin-si (KR); Yung Bin Chung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 502 days.

(21) Appl. No.: 18/131,535

(22) Filed: Apr. 6, 2023

(65) Prior Publication Data

US 2024/0057410 A1    Feb. 15, 2024

(30) Foreign Application Priority Data

Aug. 10, 2022 (KR) ................. 10-2022-0099953

(51) Int. Cl.
*H10K 59/131* (2023.01)
*H10K 59/12* (2023.01)

(52) U.S. Cl.
CPC ....... *H10K 59/131* (2023.02); *H10K 59/1201* (2023.02)

(58) Field of Classification Search
CPC ............. H10K 59/131; H10K 59/1201
USPC ................................................ 257/72
See application file for complete search history.

(56) References Cited

U.S. PATENT DOCUMENTS

2017/0148856 A1\* 5/2017 Choi .................. H10K 59/873
2019/0198593 A1\* 6/2019 Jo .................... H10K 59/80515

FOREIGN PATENT DOCUMENTS

| CN | 105489784 | 4/2016 |
| KR | 1998042840 | 8/1998 |
| KR | 1020020059956 | 7/2002 |
| KR | 1020050054315 | 6/2005 |
| KR | 1020140077624 | 6/2014 |
| KR | 101441545 | 9/2014 |
| KR | 101642603 | 7/2016 |
| KR | 101716454 | 3/2017 |
| KR | 1020190076218 A | 7/2019 |

OTHER PUBLICATIONS

International Search Report—PCT/KR2023/009935 dated Oct. 12, 2023, citing references listed within.

\* cited by examiner

*Primary Examiner* — Xia L Cross
(74) *Attorney, Agent, or Firm* — CANTOR COLBURN LLP

(57) ABSTRACT

A display device includes a substrate including a flat area and a trench area, which is recessed from the flat area; an electrode pattern disposed on the substrate, where the electrode pattern includes a dent portion, which is bent along a profile of the trench area of the substrate; a planarization layer inserted in the dent portion; a first insulating layer covering the substrate, the electrode pattern, and the planarization layer; and a light-emitting element disposed on the first insulating layer, where the planarization layer includes an organic-inorganic composite material.

20 Claims, 24 Drawing Sheets

DISPLAY DEVICE AND METHOD OF MANUFACTURING THE SAME

This application claims priority to Korean Patent Application No. 10-2022-0099953, filed on Aug. 10, 2022, and all the benefits accruing therefrom under 35 U.S.C. § 119, the content of which in its entirety is herein incorporated by reference.

BACKGROUND

1. Field

The disclosure relates to a display device and a method of manufacturing the display device.

2. Description of the Related Art

Display devices are becoming more important with developments in multimedia technology. Accordingly, various display devices such as an organic light-emitting diode (OLED) display device, a liquid crystal display (LCD) device, and the like are widely used in various fields.

Typically, a display device includes a display panel such as an organic light-emitting display panel or an LCD panel. A light-emitting display panel may include light-emitting elements such as, for example, light-emitting diodes (LEDs). Examples of the LEDs include organic LEDs (OLEDs) using an organic material as a fluorescent material and inorganic LEDs using an inorganic material as a fluorescent material.

SUMMARY

Embodiments of the disclosure provide a display device capable of preventing reliability from being lowered by the thickness of wiring or electrode.

Embodiments of the disclosure also provide a method of manufacturing a display device capable of preventing reliability from being lowered by the thickness of wiring or electrode.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device includes: a substrate including a flat area and a trench area, which is recessed from the flat area; an electrode pattern disposed on the substrate, where the electrode pattern includes a dent portion, which is bent along a profile of the trench area of the substrate; a planarization layer inserted in the dent portion; a first insulating layer covering the substrate, the electrode pattern, and the planarization layer; and a light-emitting element disposed on the first insulating layer, where the planarization layer includes an organic-inorganic composite material.

In an embodiment, the organic-inorganic composite material may include an organic material and an inorganic material, and a content of the inorganic material may be greater than a content of the organic material.

In an embodiment, the organic material may include siloxane, and the inorganic material includes silicon oxide ($SiO_2$).

In an embodiment, the electrode pattern may include an exposed surface exposed by the flat area of the substrate and the planarization layer, and a top surface of the flat area, the exposed surface, and a top surface of the planarization layer may be disposed on a same plane.

In an embodiment, the display device may further include a thin-film transistor (TFT) disposed between the first insulating layer and the light-emitting element, where a semiconductor layer of the TFT may overlap the electrode pattern.

In an embodiment, the light-emitting element may include a first electrode, a light-emitting layer, which is disposed on the first electrode, and a second electrode, which is disposed on the light-emitting layer, the display device may further include a TFT disposed between the first insulating layer and the light-emitting element, and the first electrode of the light-emitting element and the TFT may be electrically connected to each other.

In an embodiment, the first electrode may be in direct contact with the exposed surface of the electrode pattern through a contact hole defined through the first insulating layer.

In an embodiment, the first electrode may be in direct contact with the electrode pattern through a contact hole defined through the first insulating layer and the planarization layer.

In an embodiment, the electrode pattern may include an exposed surface exposed by the flat area of the substrate and the planarization layer, and the exposed surface may be curved.

In an embodiment, the electrode pattern may include copper (Cu).

According to an embodiment of the disclosure, a display device includes: a first insulating layer disposed on a substrate, where the first insulating layer includes a flat area and a trench area, which is recessed from the flat area; an electrode pattern disposed on the substrate, where the electrode pattern includes a dent portion, which is bent along a profile of the trench area of the substrate; a planarization layer inserted in the dent portion; a second insulating layer covering the substrate, the electrode pattern, and the planarization layer; and a light-emitting element disposed on the second insulating layer, where the planarization layer includes an organic-inorganic composite material.

In an embodiment, the organic-inorganic composite material may include an organic material and an inorganic material, and a content of the inorganic material may be greater than a content of the organic material.

In an embodiment, the organic material may include siloxane, and the inorganic material includes silicon oxide ($SiO_2$).

In an embodiment, the electrode pattern may include an exposed surface exposed by the flat area of the substrate and the planarization layer, and a top surface of the flat area, the exposed surface and a top surface of the planarization layer may be disposed on a same plane.

In an embodiment, a display device may further include a thin-film transistor (TFT) disposed between the first insulating layer and the light-emitting element, where a semiconductor layer of the TFT may overlap the electrode pattern.

In an embodiment, the light-emitting element may include a first electrode, a light-emitting layer, which is disposed on the first electrode, and a second electrode, which is disposed on the light-emitting layer, the display device further comprises a TFT disposed between the first insulating layer and the light-emitting element, and the first electrode of the light-emitting element and the TFT may be electrically connected to each other.

In an embodiment, the display device may further include a TFT disposed between the substrate and the light-emitting element, where the electrode pattern may be a gate electrode of the TFT.

According to an embodiment of the disclosure, a method of manufacturing a display device, includes: preparing a substrate; forming a flat area and a trench area, which is recessed from the flat area, on the substrate; forming an electrode material layer, which is bent in part along a profile of the trench area, on the substrate; forming an organic-inorganic composite material layer on the electrode material layer; forming a planarization layer, which is disposed on a part of the electrode material layer, by etching the organic-inorganic composite material layer; forming an electrode layer by selectively etching a part of the electrode material layer not covered by the planarization layer; and forming a first insulating layer on the flat area of the substrate, the planarization layer, and the electrode layer.

In an embodiment, each of the organic-inorganic composite material layer and the organic-inorganic composite layer may include an organic material and an inorganic material, and a content of the inorganic material may be greater than a content of the organic material.

In an embodiment, the organic material may include siloxane, and the inorganic material includes silicon oxide ($SiO_2$).

According to embodiments of the disclosure, the reliability of a display device can be improved.

In such embodiment, a display device with an improved reliability can be provided.

It should be noted that the effects of the disclosure are not limited to those described above, and other effects of the disclosure will be apparent from the following description.

BRIEF DESCRIPTION OF THE DRAWINGS

The above and other features of the disclosure will become more apparent by describing in detail embodiments thereof with reference to the attached drawings, in which.

DETAILED DESCRIPTION

Figure 1:
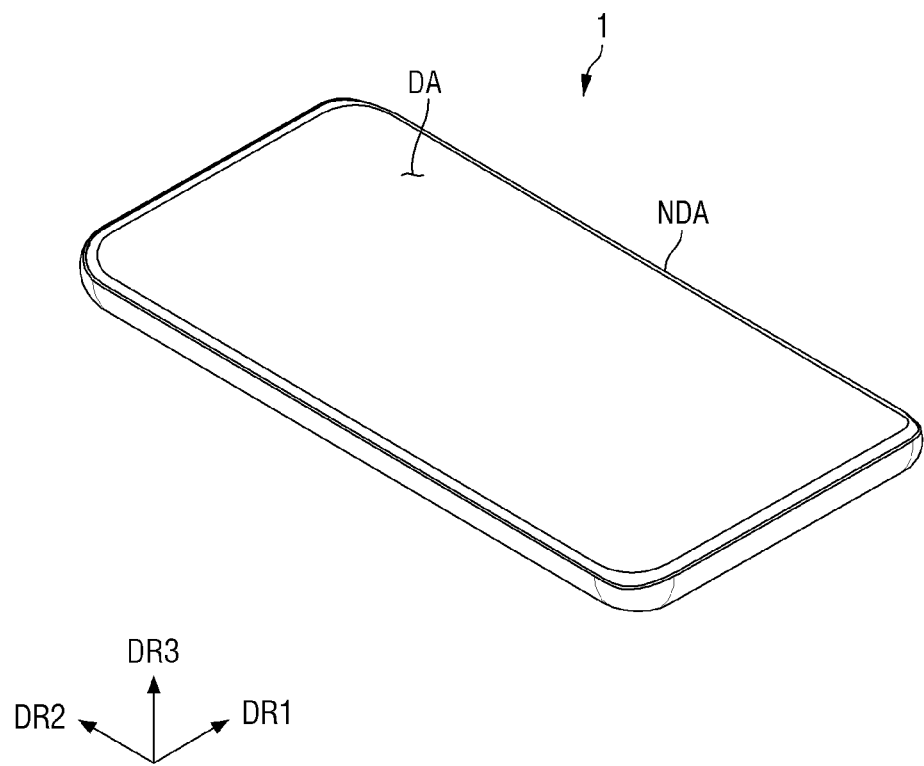
FIG. 1 is a perspective view of an electronic device according to an embodiment of the disclosure.

The invention will now be described more fully hereinafter with reference to the accompanying drawings, in which various embodiments are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Features of each of various embodiments of the present disclosure may be partially or entirely combined with each other and may technically variously interwork with each other, and respective embodiments may be implemented independently of each other or may be implemented together in association with each other.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Embodiments of the disclosure will hereinafter be described with reference to the accompanying drawings.

FIG. 1 is a perspective view of an electronic device according to an embodiment of the disclosure.

Referring to FIG. 1, an embodiment of an electronic device 1 displays a moving image or a still image. The electronic device 1 may refer to nearly all types of electronic devices including a display screen. Examples of the electronic device 1 include a television (TV), a notebook computer, a monitor, an electronic billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book reader, a portable multimedia player (PMP), a navigation device, a gaming console, a digital camera, and a camcorder.

First, second, and third directions DR1, DR2, and DR3 are defined as illustrated in FIG. 1. Referring to FIG. 1, the first and second directions DR1 and DR2 may be orthogonal to each other, the first and third directions DR1 and DR3 may be orthogonal to each other, and the second and third directions DR2 and DR3 may be orthogonal to each other. The first direction DR1 may be understood as being a horizontal direction, the second direction DR2 may be understood as being a vertical direction, and the third direction DR3 may be understood as being a thickness direction. The term "direction," as used herein, may refer to both sides in each particular direction. Selectively, one side in a particular direction may be referred to as a first side in the particular direction, and the other side in the particular direction may be referred to as a second side in the particular direction. Referring to FIG. 1, a side in each direction, pointed to by each arrow may be referred to as, but is not limited to, a first side, and the opposite side may be referred to as, but is not limited to, a second side.

For convenience of description, a surface of the electronic device 1 (or each element of the electronic device 1) that faces a display direction (i.e., a first side in the third direction DR3) may be referred to as a top surface, and the opposite surface of the electronic device 1 may be referred to as a bottom surface. However, the disclosure is not limited thereto. Alternatively, the surfaces of the electronic device 1 may also be referred to as a front side and a rear side or as a first surface and a second surface. When describing the relative location of each element of the electronic device 1, an element on a first side, in the third direction DR3, of another element may also be referred to as being above the other element, and an element on a second side, in the third direction DR3, of another element may also be referred to as being below the other element.

Figure 2:
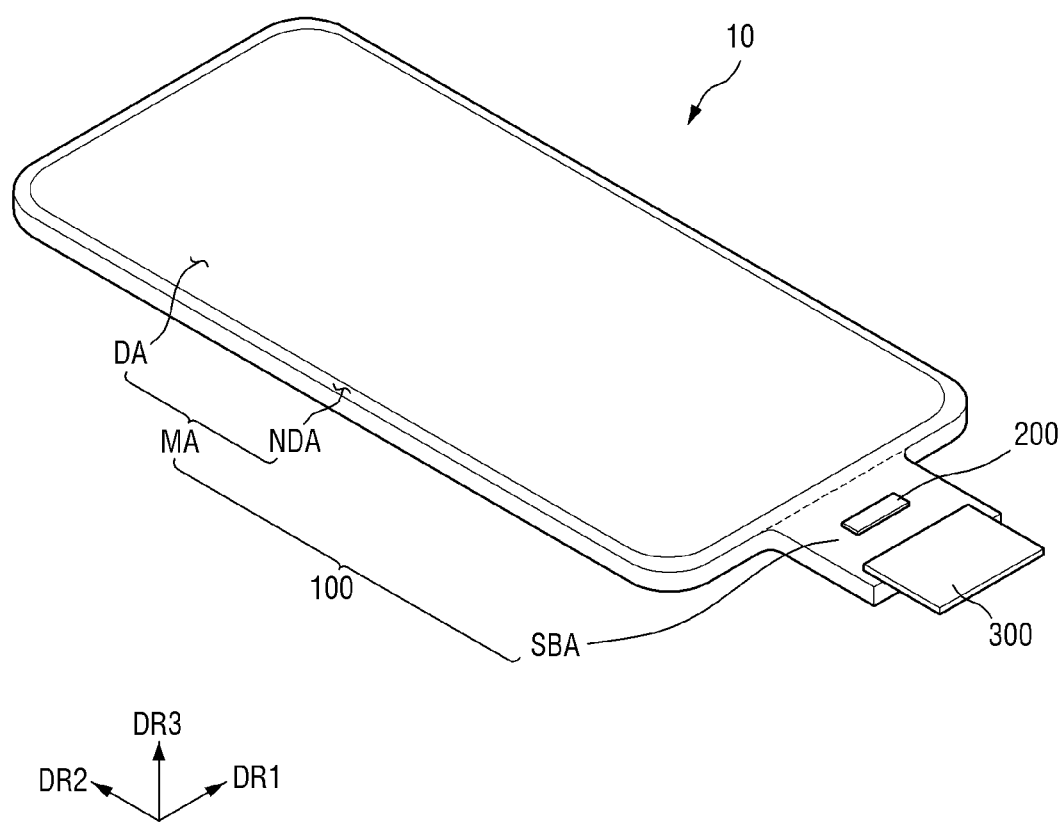
FIG. 2 is a perspective view of a display device included in the electronic device of FIG. 1.

The electronic device 1 may include a display device 10 (of FIG. 2). Examples of the display device 10 include an inorganic light-emitting diode display device, an organic light-emitting diode (OLED) display device, a quantum-dot light-emitting display device, a plasma display device, and a field emission display (FED) device. Hereinafter, for convenience of description, embodiment where the display device 10 is an OLED display device will be described in detail, but the disclosure is not limited thereto. Alternatively, the display device 10 may also be applicable to various other display devices.

The shape of the electronic device 1 may be selected from various shapes. In an embodiment, for example, the electronic device 1 may have a rectangular shape that extends longer horizontally than vertically, a rectangular shape that extends longer vertically than horizontally, a square shape, a rectangular shape with rounded corners, another polygonal shape, or a circular shape. A display area DA of the electronic device 1 may generally have a similar shape to the electronic device 1. FIG. 1 illustrates an embodiment where the electronic device 1 has a rectangular shape that extends longer in the second direction DR2 than in the first direction DR1.

The electronic device 1 may include a display area DA and a non-display area NDA. The display area DA may be an area where an image can be displayed, and the non-display area NDA may be an area where an image is not displayed. The display area DA may also be referred to as an active area, and the non-display area NDA may also be referred to as an inactive area. The display area DA may generally account for the middle of the electronic device 1.

FIG. 2 is a perspective view of a display device included in the electronic device of FIG. 1.

Referring to FIGS. 1 and 2, in an embodiment, the electronic device 1 may include a display device 10. The display device 10 may provide a display screen for the electronic device 1. The display device 10 may have a similar shape to the electronic device 1. In an embodiment, for example, the display device 10 may have a rectangular shape having short sides extending in the first direction DR1 and long sides extending in the second direction DR1. The corners where the short sides and the long sides of the display device 10 meet may be rounded to have a predetermined curvature or may be right-angled. The shape of the display device 10 is not particularly limited, and the display device 10 may be formed in various other shapes such as another polygonal shape, a circular shape, or an elliptical shape.

The display device 10 may include a display panel 100, a display driving unit 200, a circuit board 300, and a touch driving unit 400.

The display panel 100 may include a main area MA and a sub-area SBA.

The main area MA may include a display area DA, which includes pixels for displaying an image, and a non-display area NDA, which is disposed around the display area DA. The display area DA may emit light through a plurality of emission areas or openings. In an embodiment, for example, the display panel 100 may include pixel circuits including switching elements, a pixel-defining film defining the emission areas or the openings, and self-light-emitting elements.

In an embodiment, for example, the self-light-emitting elements may include organic light-emitting diodes (OLEDs), quantum-dot light-emitting diodes (LEDs) including a quantum-dot light-emitting layer, inorganic LEDs including an inorganic semiconductor, and/or micro-LEDs, but the disclosure is not limited thereto. Hereinafter, for convenience of description, embodiments where the self-light-emitting elements are OLEDs will be described in detail.

The non-display area NDA may be on the outside of the display area DA. The non-display area NDA may be defined as an edge part of the main area MA. The non-display area NDA may include a gate driving unit (not illustrated) for providing gate signals to gate lines and fan-out lines (not illustrated) connecting the display driving unit 200 and the display area DA to each other.

The term "connect" (and variations thereof) is used herein to mean connecting one member to another member through physical contact or through yet another member. Also, an integral member may be understood as having parts connected integrally to one another. Also, when two different members are connected to each other, it may be understood that the two members are directly connected to each other or are electrically connected via another member.

The sub-area SBA may be an area extending from one side of the main area MA. The sub-area SBA may include a flexible material that is bendable, foldable, or rollable. For example, in a case where the sub-area SBA is bendable, the sub-area SBA may be bent to overlap with the main area MA in a thickness direction (or the third direction DR3). The sub-area SBA may include the display driving unit 200 and a pad unit, which is connected to the circuit board 300. The sub-area SBA may not be provided, and the display driving unit 200 and the pad unit may be disposed in the non-display area NDA.

The display driving unit 200 may output signals and voltages for driving the display panel 100. The display driving unit 200 may provide data voltages to data lines. The display driving unit 200 may provide power supply voltages to power supply lines and may provide gate control signals to the gate driving unit. The display driving unit 200 may be formed as (or defined by) an integrated circuit (IC) and may be mounted on the display panel 100 in a chip-on-glass (COG) or chip-on-plastic (COP) manner or via ultrasonic bonding. In an embodiment, for example, the display driving unit 200 may be disposed in the sub-area SBA and may overlap with the main area MA in the thickness direction when the sub-area SBA is bent. In an alternative embodiment, for example, the display driving unit 200 may be mounted on the circuit board 300.

The circuit board 300 may be attached to the pad unit of the display panel 100 via an anisotropic conductive film (ACF). Lead lines of the circuit board 300 may be electrically connected to the pad unit of the display panel 100. The circuit board 300 may be a printed circuit board (PCB), a flexible PCB (FPCB), or a flexible film such as a chip-on-film (COF).

Figure 3:
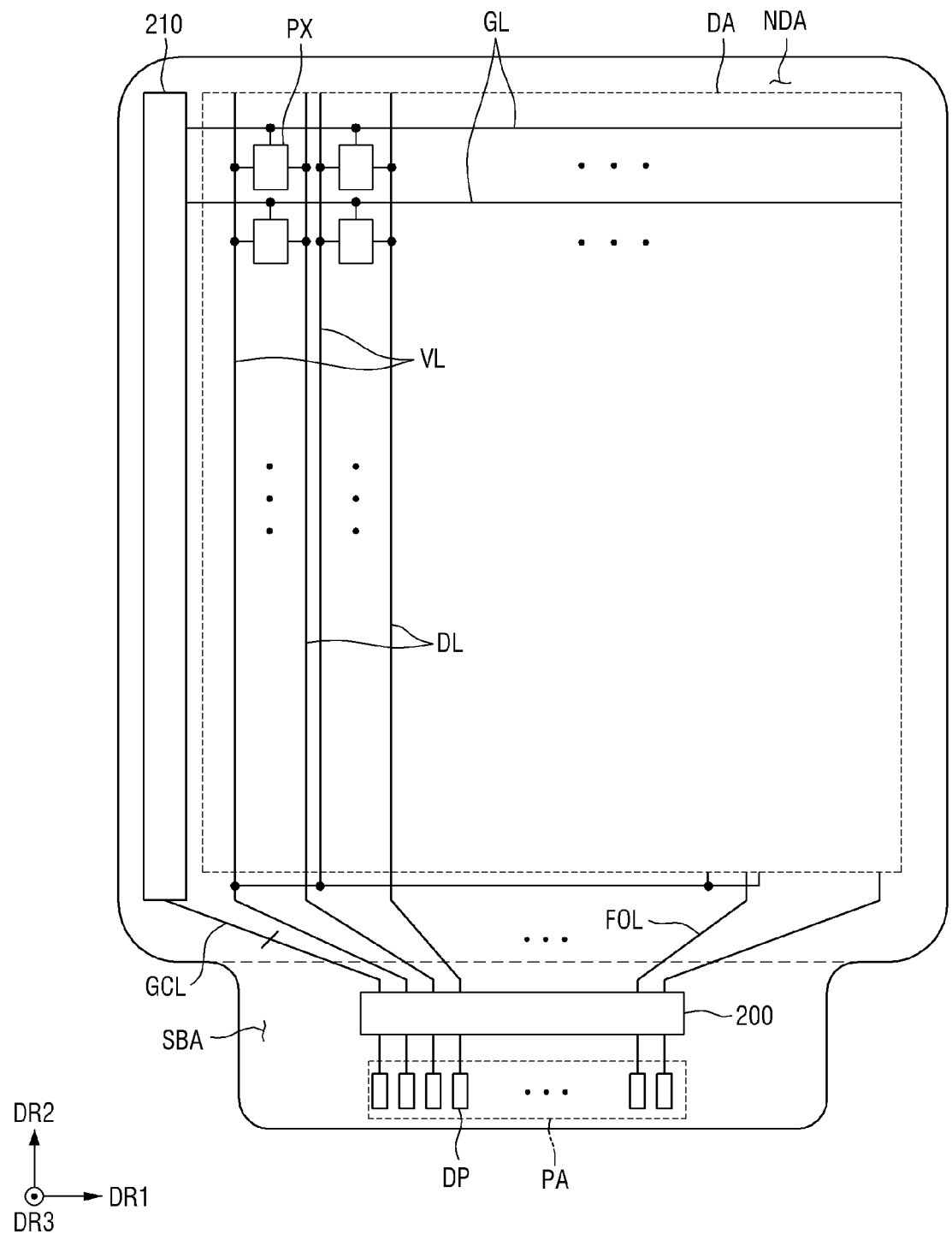
FIG. 3 is a plan view of a display panel of the display device of FIG. 2.

FIG. 3 is a plan view of the display panel of the display device of FIG. 2.

Referring to FIG. 3, an embodiment of the display panel 100 may include the display area DA and the non-display area NDA.

The display area DA may be disposed in the middle of the display panel 100. A plurality of pixels PX, a plurality of gate lines GL, a plurality of data lines DL, and a plurality of power supply lines VL may be disposed in the display area DA. The pixels PX may be defined as minimal or basic units for emitting light.

The gate lines GL may provide gate signals received from the gate driving unit 210 to the pixels PX. The gate lines GL may extend in the first direction DR1 and may be spaced apart from one another in the second direction DR2, which intersects the first direction DR1.

The data lines DL may provide data voltages received from the display driving unit 200 to the pixels PX. The data lines DL may extend in the second direction DR2 and may be spaced apart from one another in the first direction DR1.

The power supply lines VL may provide the power supply voltages received from the display driving unit 200 to the pixels PX. Here, the power supply voltages include a driving voltage, an initialization voltage, a reference voltage, and/or a low-potential voltage. The power supply lines VL may extend in the second direction DR2 and may be spaced apart from one another in the first direction DR1.

The non-display area NDA may surround the display area DA. The gate driving unit 210, fan-out lines FOL, and gate control lines GCL may be disposed in the non-display area NDA. The gate driving unit 210 may generate a plurality of gate signals based on the gate control signals and may sequentially provide the gate signals to the gate lines GL in a predefined order.

The fan-out lines FOL may extend from the display driving unit 200 to the display area DA. The fan-out lines FOL may provide data voltages received from the display driving unit 200 to the data lines DL.

The gate control lines GCL may extend from the display driving unit 200 to the gate driving unit 210. The gate control lines GCL may provide gate control signals received from the display driving unit 200 to the gate driving unit 210.

The sub-area SBA may include the display driving unit 200, a pad area PA, and first and second touch areas TPA1 and TPA2.

The display driving unit 200 may output signals and voltages for driving the display panel 100 to the fan-out lines FOL. The display driving unit 200 may provide data voltages to the data lines DL through the fan-out lines FOL. The data voltages may be provided to the pixels PX and may control the luminance of the pixels PX. The display driving unit 200 may provide gate control signals to the gate driving unit 210 through the gate control lines GCL.

The pad area PA may be disposed on an edge of the sub-area SBA. The pad area PA may be electrically connected to the circuit board 300 via an anisotropic conductive film (ACF) or a self-assembly anisotropic conductive paste (SAP).

The pad area PA may include a plurality of display pads DP. The display pads DP may be connected to an external system via the circuit board 300. The display pads DP may be connected to the circuit board 300 and may thus receive digital video data and provide the digital video data to the display driving unit 200.

In an embodiment, as described above, a plurality of lines or wires may be disposed on the display panel 100. As the greater the resistance applied to the lines or wires, the lower the efficiency of the display device 10, the thickness of the lines or wires (i.e., the length, in the third direction DR3, of the lines or wires) may be increased to reduce the resistance applied to the lines.

However, if the thickness of wiring is increased, the reliability of the display device 10 may be lowered because of step differences generated when forming lines or wires over other lines or wires. Accordingly, in an embodiment, a trench may be formed in a substrate or an insulating layer, and wiring may be arranged in the trench to reduce step differences that may be generated by the thickness of the wiring.

Figure 4:
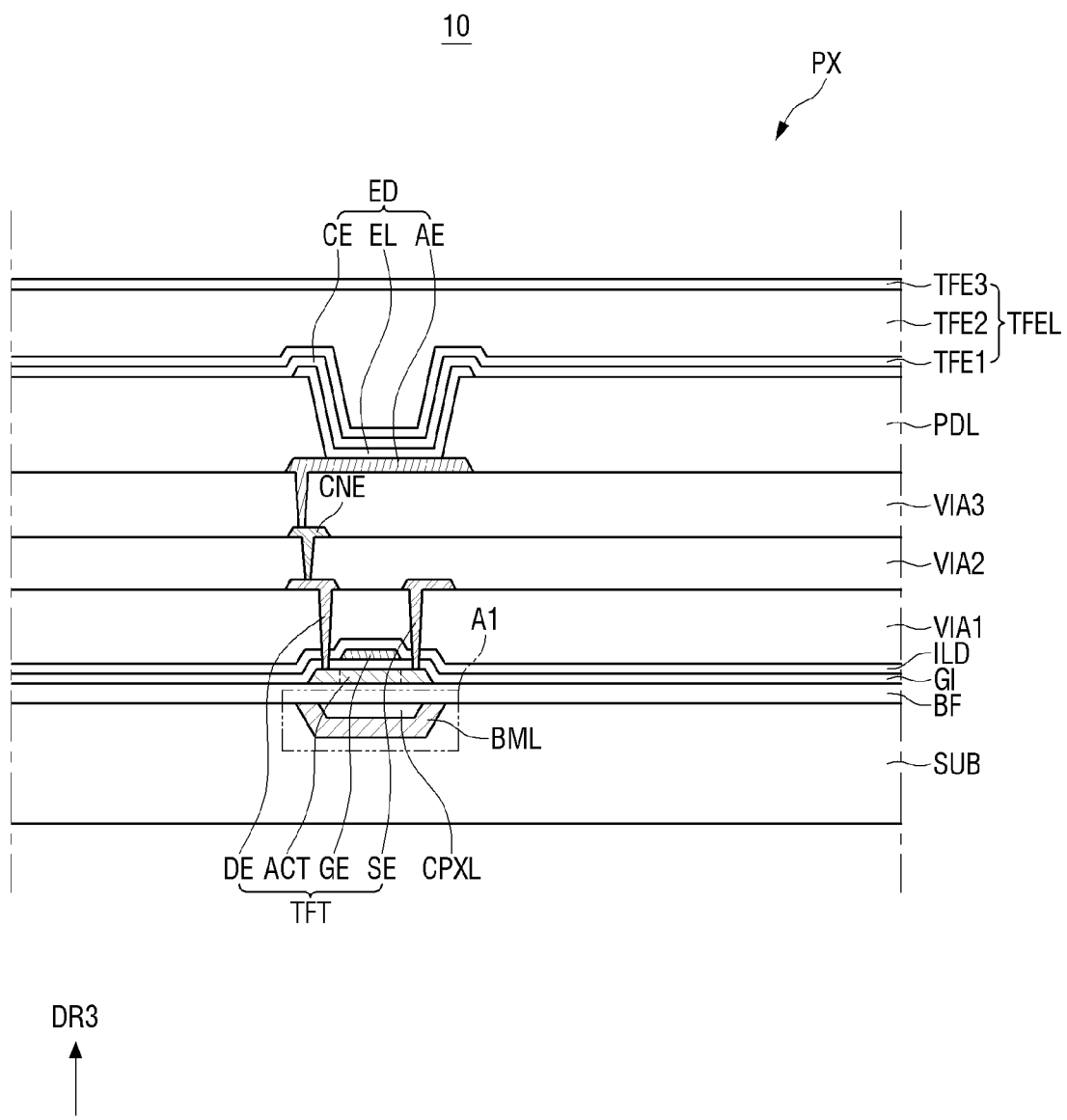
FIG. 4 is a cross-sectional view of a pixel of the display device of FIG. 2.
Figure 5:
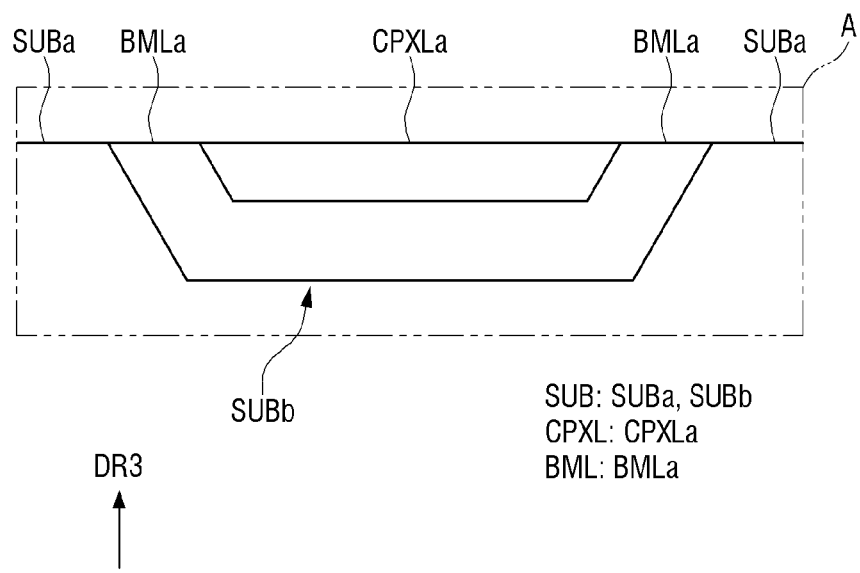
FIG. 5 is an enlarged cross-sectional view of an area A1 of FIG. 4.

FIG. 4 is a cross-sectional view of a pixel of the display device of FIG. 2. FIG. 5 is an enlarged cross-sectional view of an area A1 of FIG. 4.

The cross-sectional structure of the display device 10 will hereinafter be described with reference to FIGS. 4 and 5.

Referring to FIGS. 4 and 5, a substrate SUB may be a base substrate or a base member. The substrate SUB may be a flexible substrate that is bendable, foldable, or rollable. In an embodiment, for example, the substrate SUB may include a polymer resin such as polyimide (PI), but the disclosure is not limited thereto. In an alternative embodiment, for example, the substrate SUB may include a glass or metal material.

The substrate SUB may include a flat area SUBa and a trench area SUBb. The trench area SUBb of the substrate SUB may be depressed or recessed from the flat area SUBa of the substrate SUB into the substrate SUB, i.e., in the opposite direction of the third direction DR3. An electrode pattern may be disposed on the trench area SUBb of the substrate SUB not to protrude beyond the flat area SUBa of the substrate SUB, and this will be described later in greater detail.

A lower metal layer BML may be disposed on the trench area SUBb of the substrate SUB as an electrode pattern. The lower metal layer BML may protect a semiconductor layer ACT of a thin-film transistor TFT or may block light from the outside.

The lower metal layer BML may be disposed on the trench area SUBb of the substrate SUB and may be bent along the profile of the trench area SUBb to have a U-like shape with a substantially uniform thickness. In an embodiment, for example, the lower metal layer BML may be bent along the trench area SUBb of the substrate SUB to form a dent portion DN (of FIG. 9) where an organic-inorganic composite layer CPXL is to be accommodated, because the lower metal layer BML is formed by sputtering.

In some embodiments, the lower metal layer BML may be formed as a single layer or a multilayer, each layer therein including molybdenum (Mo), aluminum (Al), chromium (Cr), gold (Au), titanium (Ti), nickel (Ni), neodymium (Nd), copper (Cu), or an alloy thereof, but the disclosure is not limited thereto. For convenience, the lower metal layer BML will hereinafter be described as a layer including Mo.

In an embodiment, as shown in FIG. 5, the lower metal layer BML may include an exposed surface BMLa, which is exposed between the flat area SUBa of the substrate SUB and a top surface CPXLa of the organic-inorganic composite layer CPXL. The exposed surface BMLa may be disposed on substantially a same plane as one surface, in the third direction DR3, of the flat area SUBa of the substrate SUB. In an embodiment, for example, the lower metal layer BML may be disposed only on the trench area SUBb of the substrate SUB, but not on the flat area SUBa of the substrate SUB. In such an embodiment, the lower metal layer BML, may not protrude in the third direction DR3 from the substrate SUB.

The organic-inorganic composite layer CPXL may be inserted in the dent portion DN, which is formed by the bending (or a bent portion) of the lower metal layer BML. The organic-inorganic composite layer CPXL may function as a planarization layer for filling the dent portion DN formed by the lower metal layer BML to planarize the lower metal layer BML. In an embodiment, for example, the top surface CPXLa of the organic-inorganic composite layer CPXL may be disposed on substantially a same plane as the flat area SUBa of the substrate SUB and the exposed surface BMLa of the lower metal layer BML.

The organic-inorganic composite layer CPXL may include both an organic material and an inorganic material. In an embodiment, the organic-inorganic composite layer CPXL may include the mixture of an organic material and an inorganic material. In some embodiments, the organic material included in the organic-inorganic composite layer CPXL may be a siloxane-based organic material, and the inorganic material included in the organic-inorganic composite layer CPXL may be silicon oxide ($SiO_2$). However, the disclosure is not limited to this.

The organic material included in the organic-inorganic composite layer CPXL may planarize the lower metal layer BML by filling the dent portion DN formed by the lower metal layer BML. The inorganic material included in the organic-inorganic composite layer CPXL may improve the thermal resistance of the organic-inorganic composite layer CPXL at a high temperature of 350° C. to 400° C., which typically is a requirement for the fabrication of the display device 10.

If the organic-inorganic composite layer CPXL includes only the organic material, the organic-inorganic composite layer CPXL can easily fill the dent portion DN formed by the lower metal layer BML to planarize the lower metal layer BML, but the thermal resistance of the organic-inorganic composite layer CPXL may be lowered. As a result, a relatively large amount of gas may be released at a high temperature of 350° C. to 400° C. in a subsequent process so that cracks may be generated in the organic-inorganic composite layer CPXL. On the contrary, if the organic-inorganic composite layer CPXL includes only the inorganic material, the thermal resistance of the organic-inorganic composite layer CPXL can be improved, and a relatively small amount of gas can be released at a high temperature of 350° C. to 400° C. in a subsequent process. However, the organic-inorganic composite layer CPXL may not be able to properly fill the dent portion DN formed by the lower metal layer BML. Thus, in an embodiment, the organic-inorganic composite layer CPXL is desired to include both the organic material and the inorganic material to some extent.

In some embodiments, the content of the inorganic material in the organic-inorganic composite layer CPXL may be greater than the content of the organic material in the organic-inorganic composite layer CPXL. In an embodiment, for example, the content of the inorganic material in the organic-inorganic composite layer CPXL may be, but is not limited to, 60%, and the content of the organic material in the organic-inorganic composite layer CPXL may be, but is not limited to, 40%. Even if the content of the organic material in the organic-inorganic composite layer CPXL is relatively small, the organic-inorganic composite layer CPXL can easily fill the dent portion DN formed by the lower metal layer BML. Thus, the thermal resistance of the organic-inorganic composite layer CPXL can be improved by increasing the content of the inorganic material in the organic-inorganic composite layer CPXL.

In such an embodiment, even though the lower metal layer BML is present on the substrate SUB, other elements on the substrate SUB can be formed on a relatively flat surface, step differences may not be formed, and the thermal resistance of the display device 10 can be improved so that the reliability of the display device 10 can be improved. In such an embodiment, as the lower metal layer BML can be further spaced apart in the third direction DR3 from various other elements by the organic-inorganic composite layer CPXL, parasitic capacitance can be effectively prevented from being generated between the lower metal layer BML and the organic-inorganic composite layer CPXL, without increasing the thickness of the display panel 100.

The buffer layer BF may be disposed on the flat area SUBa of the substrate SUB, the exposed surface BMLa of the lower metal layer BML, and the top surface CPXLa of the organic-inorganic composite layer CPXL. In such an embodiment, as described above, as the flat area SUBa of the substrate SUB, the exposed surface BMLa of the lower metal layer BML, and the top surface CPXLa of the organic-inorganic composite layer CPXL are disposed on substantially the same plane, the buffer layer BF may be substantially flat without step differences.

The buffer layer BF may include an inorganic film capable of preventing the infiltration of the air or moisture. In an embodiment, for example, the buffer layer BF may include a plurality of inorganic films that are alternately stacked.

The thin-film transistor TFT may be disposed on the buffer layer BF and may form a pixel circuit of a pixel. For example, the thin-film transistor TFT may be a driving transistor or a switching transistor. The thin-film transistor TFT may include a semiconductor layer ACT, a source electrode SE, a drain electrode DE, and a gate electrode GE.

The semiconductor layer ACT may be disposed on the buffer layer BF. The semiconductor layer ACT may overlap the lower metal layer BML and the gate electrode GE in the thickness direction (or the third direction DR3) and may be insulated from the gate electrode GE by the gate insulating layer GI.

The gate electrode GE may be disposed on the gate insulating layer GI. The gate electrode GE may overlap the semiconductor layer ACT with the gate insulating layer GI interposed therebetween.

The gate insulating layer GI may be disposed on the semiconductor layer ACT. The gate electrode GE may cover the semiconductor layer ACT and the buffer layer BF and may insulate the semiconductor layer ACT and the gate electrode GE. In such an embodiment, contact holes, in which the source electrode SE and the drain electrode DE are disposed, may be defined through the gate insulating layer GI.

An interlayer insulating layer ILD may cover the gate electrode GE and the gate insulating layer GI. In an embodiment, contact holes, in which the source electrode SE and the drain electrode DE are disposed, may be defined through the interlayer insulating layer ILD. The contact holes of the interlayer insulating layer ILD may be connected to the contact holes of the gate insulating layer GI and contact holes of a first via insulating layer VIA1.

A capacitor electrode (not illustrated) may be disposed on the interlayer insulating layer ILD. The capacitor electrode may overlap the gate electrode GE in the third direction DR3. The capacitor electrode and the gate electrode GE may form or collectively define a capacitor.

The first via insulating layer VIA1 may cover the interlayer insulating layer ILD. In an embodiment, contact holes, in which the source electrode SE and the drain electrode DE are disposed, may be defined through the first via insulating layer VIA1. The contact holes of the first via insulating layer VIA1 may be connected to the contact holes of the interlayer insulating layer ILD and the contact holes of the gate insulating layer GI.

The source electrode SE and the drain electrode DE may be disposed on the first via insulating layer VIA1. The source electrode SE and the drain electrode DE may be electrically connected to the semiconductor layer ACT of the thin-film transistor TFT. In an embodiment, for example, the source electrode SE and the drain electrode DE may be inserted in the contact holes of each of the first via insulating layer VIA1, the interlayer insulating layer ILD, and the gate insulating layer GI and may thus be in contact with the semiconductor layer ACT of the thin-film transistor TFT.

A second via insulating layer VIA2 may cover the source electrode SE, the drain electrode DE, and the first via insulating layer VIA1. The second via insulating layer VIA2 may protect the thin-film transistor TFT. In an embodiment, a contact hole, in which a connecting electrode CNE is disposed, may be defined through the second via insulating layer VIA2.

The connecting electrode CNE may be disposed on the second via insulating layer VIA2. The connecting electrode CNE may electrically connect a pixel electrode AE of a light-emitting element ED and the drain electrode DE of the thin-film transistor TFT. The connecting electrode CNE may be inserted in the contact hole of the second via insulating layer VIA2 and may be in contact with the drain electrode DE.

A third via insulating layer VIA3 may cover the connecting electrode CNE and the second via insulating layer VIA2. In an embodiment, a contact hole, in which the pixel electrode AE of the light-emitting element ED is disposed, may be defined through the third via insulating layer VIA3.

The light-emitting element ED may include the pixel electrode AE, a light-emitting layer EL, and a common electrode CE.

The pixel electrode AE may be disposed on the third via insulating layer VIA3. The pixel electrode AE may be disposed to with an opening of a pixel-defining film PDL. The pixel electrode AE may be electrically connected to the drain electrode DE of the thin-film transistor TFT via the connecting electrode CNE.

The pixel-defining film PDL may be disposed on the third via insulating layer VIA3 and part of the pixel electrode AE, and an opening may be defined through the pixel-defining film PDL. The opening of the pixel-defining film PDL may expose part of the pixel electrode AE.

The pixel-defining film PDL may separate and insulate the pixel electrode AE of the light-emitting element ED from pixel electrodes AE of other light-emitting elements ED. The pixel-defining film PDL may include a light-absorbing material and may thus prevent the reflection of light. In an embodiment, for example, the pixel-defining film PDL may include a polyimide (PI)-based binder and the mixture of red, green, and blue pigments. Alternatively, the pixel-defining film PDL may include a cardo-based binder resin and the mixture of a lactam black pigment and a blue pigment. Alternatively, the pixel-defining film PDL may include carbon black.

The light-emitting layer EL may be disposed on parts of the pixel electrode AE and the pixel-defining film PDL. In an embodiment, for example, the light-emitting layer EL may be disposed on a surface of the pixel electrode AE exposed by the opening of the pixel-defining film PDL and on part of the pixel-defining film PDL.

The light-emitting layer EL may be an organic light-emitting layer formed of an organic material. In this case, as the thin-film transistor TFT applies a predetermined voltage to the pixel electrode AE of the light-emitting element ED and a common electrode CE of the light-emitting element ED receives a common voltage or a cathode voltage, holes and electrons may move to the light-emitting layer EL through a hole transport layer and an electron transport layer, respectively, and may combine together in the light-emitting layer EL to emit light.

The common electrode CE may be disposed on the light-emitting layer EL and the pixel-defining film PDL. In an embodiment, for example, the common electrode CE may be disposed on the light-emitting layer EL and on part of the pixel-defining film PDL where the light-emitting layer EL is not disposed. In an embodiment, the common electrode CE may be formed in the entire display area DA not as an electrode separate for each individual pixel PX, but as an electrode shared in common by all the pixels PX.

The common electrode CE may receive a common voltage or a low-potential voltage. As the pixel electrode AE receives a voltage corresponding to a data voltage and the common electrode CE receives a low-potential voltage, an electric potential difference may be generated between the pixel electrode AE and the common electrode CE, and as a result, the light-emitting layer EL may emit light.

An encapsulation layer TFEL may be disposed on the common electrode CE and may cover the light-emitting element ED. In some embodiments, the encapsulation layer TFEL may include at least one inorganic film and at least one organic film and may prevent the infiltration of a foreign material such as oxygen, moisture, or dust into the light-emitting element ED.

The encapsulation layer TFEL may include first, second, and third encapsulation layers TFE1, TFE2, and TFE3, which are sequentially stacked in the third direction DR3. The first and third encapsulation layers TFE1 and TFE3 may be inorganic encapsulation layers, and the second encapsulation layer TFE2, which is disposed between the first and third encapsulation layers TFE1 and TFE3, may be an organic encapsulation layer.

The first and third encapsulation layers TFE1 and TFE3 may include an inorganic insulating material. The inorganic insulating material may include aluminum oxide, titanium oxide, tantalum oxide, hafnium oxide, zinc oxide, silicon oxide, silicon nitride, and/or silicon oxynitride.

The second encapsulation layer TFE2 may include a polymer material. The polymer material may include an acrylic resin, an epoxy resin, polyimide, or polyethylene. The second encapsulation layer TFE2 may include an acrylic resin, for example, polymethyl methacrylate or polyacrylic acid. The second encapsulation layer TFE2 may be formed by curing a monomer or applying a polymer.

It will hereinafter be described an embodiment of a process of forming the lower metal layer BML and the organic-inorganic composite layer CPXL on the substrate SUB.

FIGS. 6 through 13 illustrate a method of manufacturing a display device according to an embodiment of the disclosure.

Figure 6:
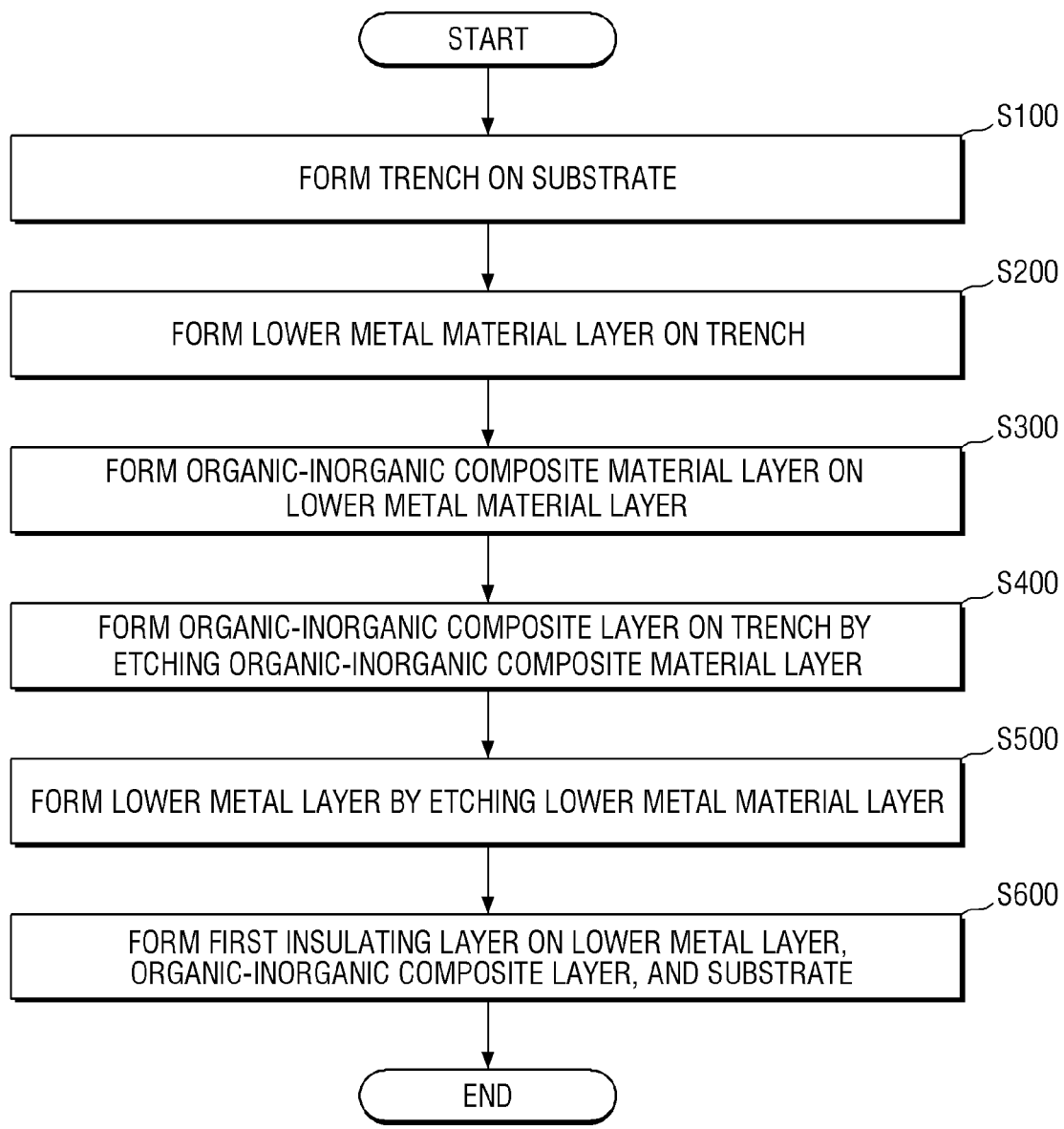
FIGS. 6 through 13 illustrate a method of manufacturing a display device according to an embodiment of the disclosure.

Referring to FIG. 6, an embodiment of the method of manufacturing a display device includes forming a flat area SUBa and a trench area SUBb on a substrate SUB (S100), forming a lower metal material layer BML' on the substrate SUB (S200), forming an organic-inorganic composite layer CPXL' on the lower metal material layer BML' (S300), forming an organic-inorganic composite layer CPXL on the trench area SUBb by etching the organic-inorganic composite material layer CPXL' (S400), forming a lower metal layer BML by etching the lower metal material layer BML' (S500), and forming a buffer layer BF on the organic-inorganic composite layer CPXL and the substrate SUB (S600).

Figure 7:
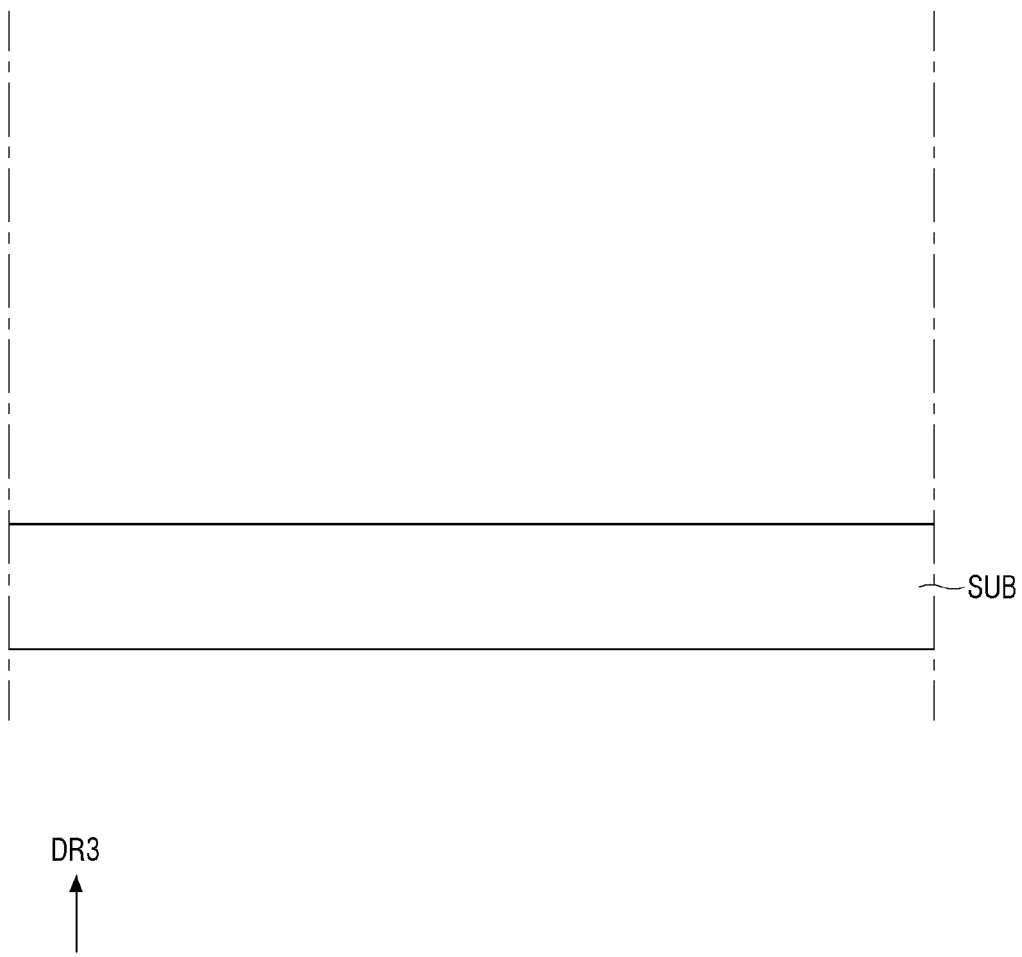
Figure 8:
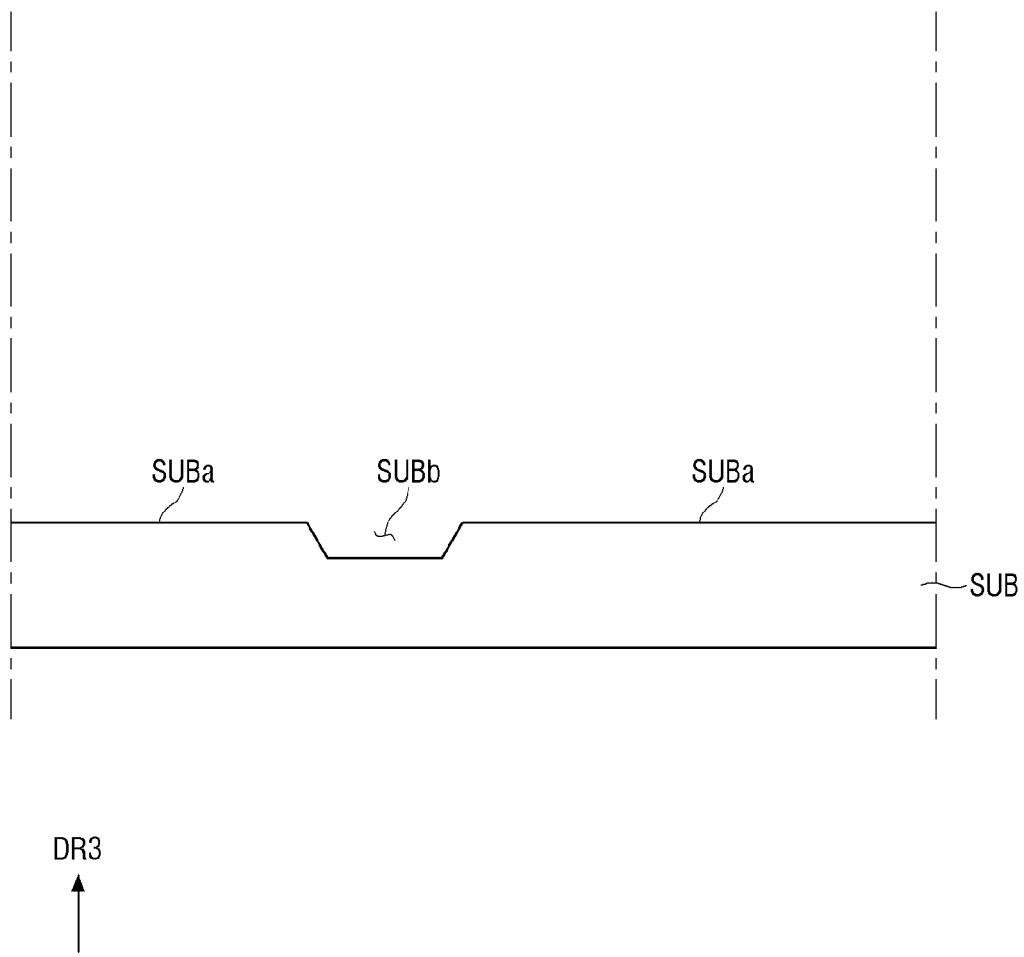

Referring first to FIGS. 7 and 8, the flat area SUBa and the trench area SUBb are formed on the substrate (S100). The flat area SUBa and the trench area SUBb may be formed using, for example, a mask.

In an embodiment, as described above, the trench area SUBb may be an area depressed or recessed from the flat area SUBa. The trench area SUBb may not penetrate the substrate SUB in a third direction DR3.

Figure 9:
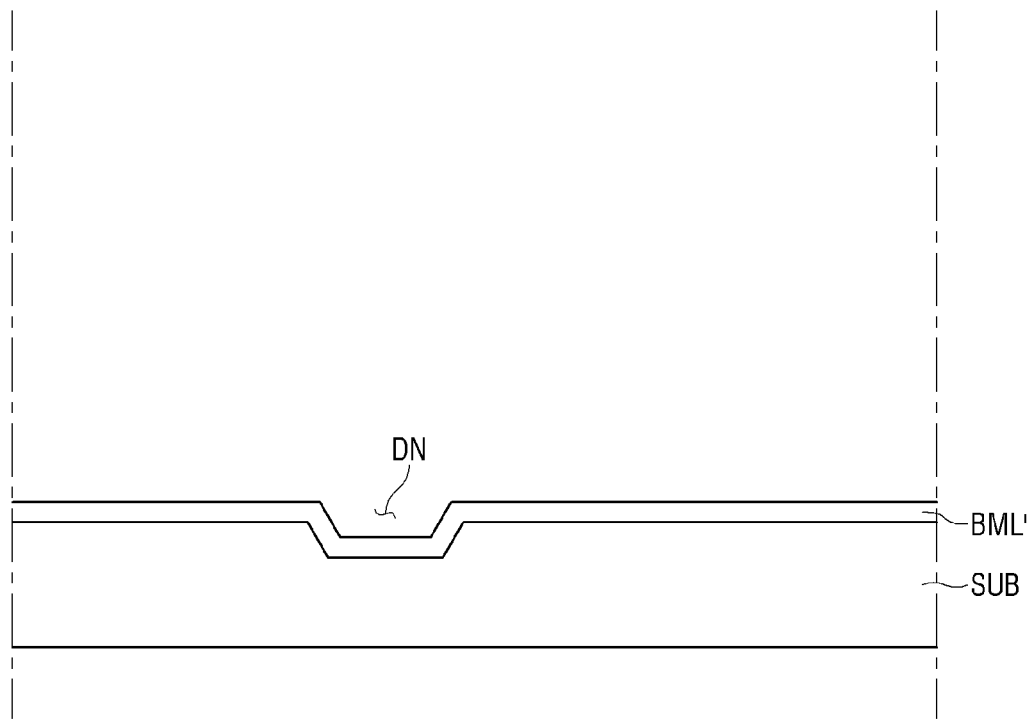

Thereafter, referring to FIG. 9, the lower metal material layer BML' is formed on the substrate SUB (S200). The lower metal material layer BML' may be formed by, for example, sputtering, but the disclosure is not limited thereto.

The lower metal material layer BML' may have a substantially constant thickness and be bent along the profile of the trench area SUBb of the substrate SUB to form a dent portion DN.

The lower metal material layer BML', which is to be formed into the lower metal layer BML through etching, may include a same material as the lower metal layer BML. In some embodiments, the lower metal material layer BML' may include Mo, but the disclosure is not limited thereto.

Figure 10:
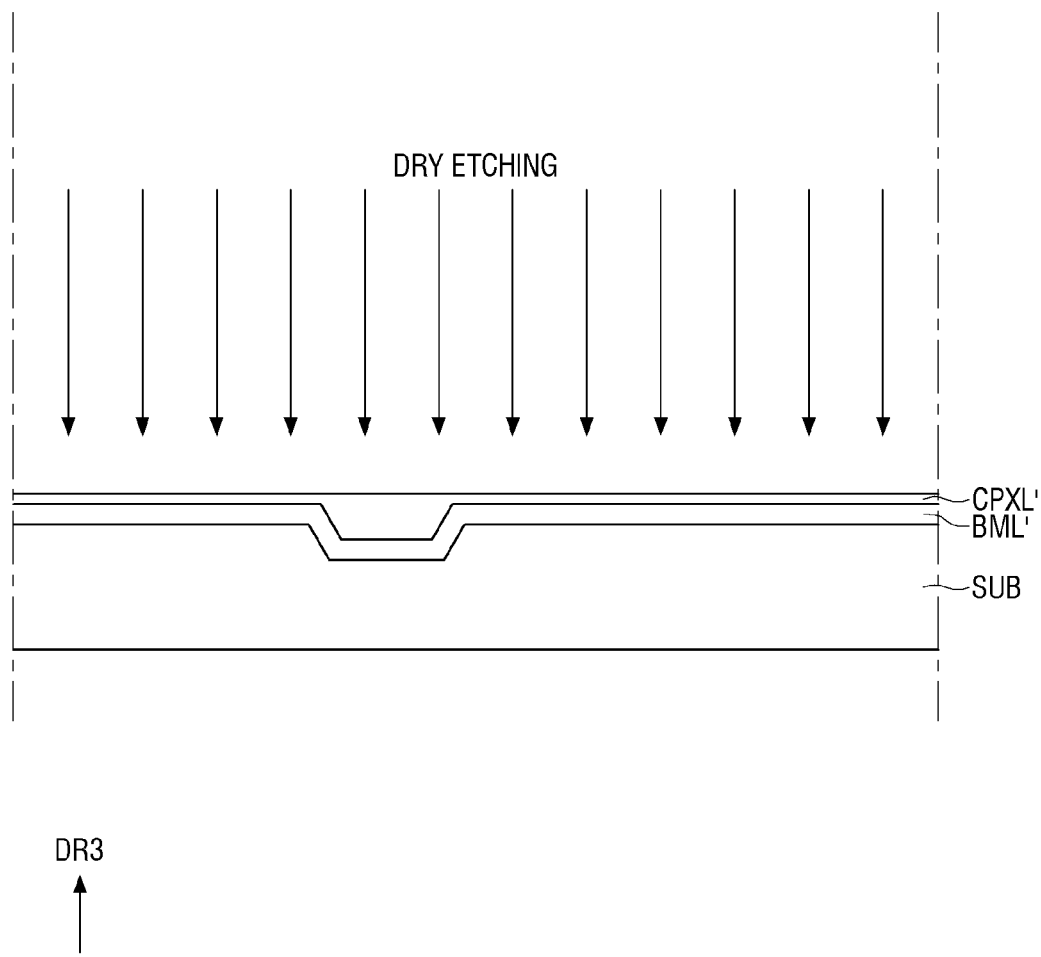

Thereafter, referring to FIG. 10, the organic-inorganic composite material layer CPXL' is formed on the lower metal material layer BML' (S300), and the organic-inorganic composite layer CPXL is formed on the trench area SUBb by etching the organic-inorganic composite material layer CPXL' (S400). The organic-inorganic composite material layer CPXL' may be etched by dry etching, but the disclosure is not limited thereto.

The organic-inorganic composite material layer CPXL', which is to be formed into the organic-inorganic composite layer CPXL through etching, may include a same material as the organic-inorganic composite layer CPXL. That is, the organic-inorganic composite material layer CPXL' may include the mixture of an organic material and an inorganic material. In some embodiments, the organic material may be, but is not limited to, a siloxane-based organic material, and the inorganic material may be, but is not limited to, $SiO_2$.

In an embodiment, as described above, as the organic-inorganic composite material layer CPXL' includes both the organic material and the inorganic material, the organic-inorganic composite material layer CPXL' may fill the dent portion DN to planarize a step difference formed by the lower metal material layer BML'.

The organic-inorganic composite material layer CPXL' may be etched by dry etching using a first etching gas. The first etching gas may be a chlorine (Cl) gas and may not react with the lower metal material layer BML'. Accordingly, only the organic-inorganic composite material layer CPXL' may be selectively etched, and as a result, the organic-inorganic composite layer CPXL, which is inserted in the dent portion DN formed by the lower metal material layer BML', may be formed, as illustrated in FIG. 11.

That is, as the organic-inorganic composite material layer CPXL' is not completely etched away, the fabrication of a display device 10 can be further simplified.

Figure 11:
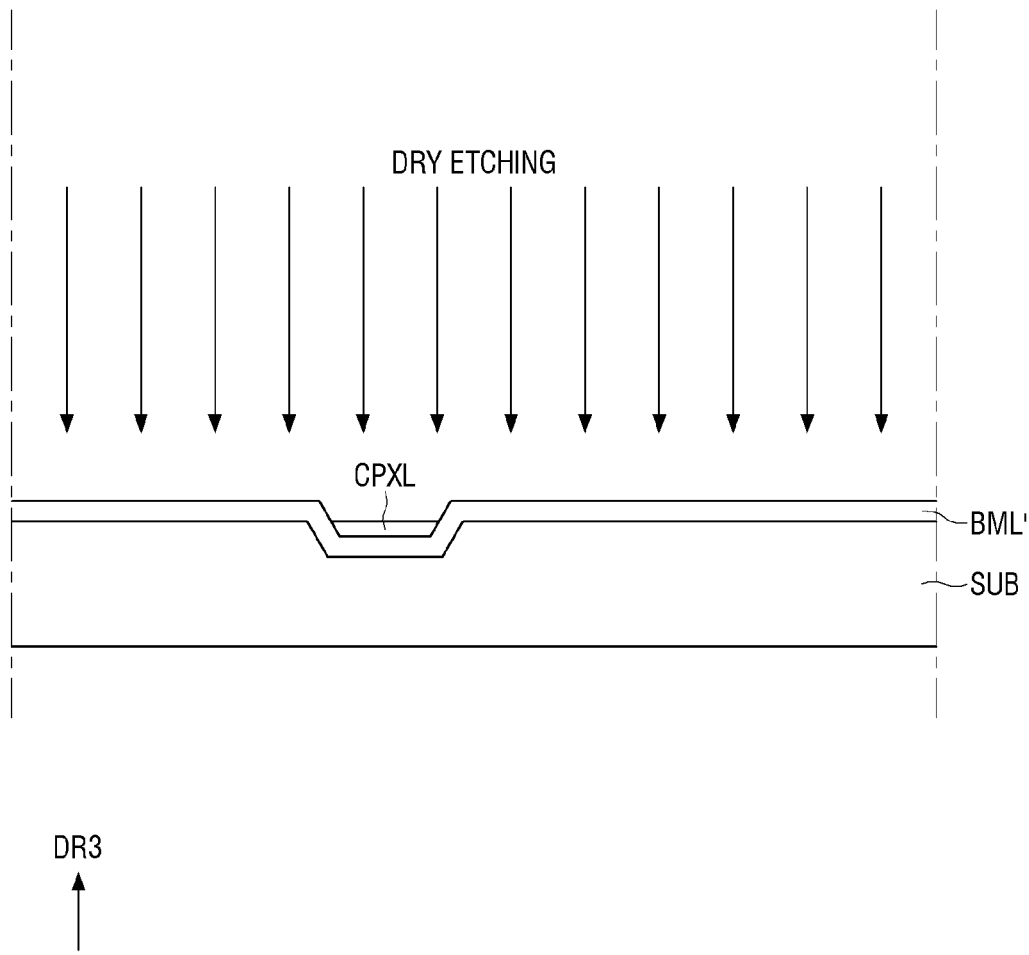
Figure 12:
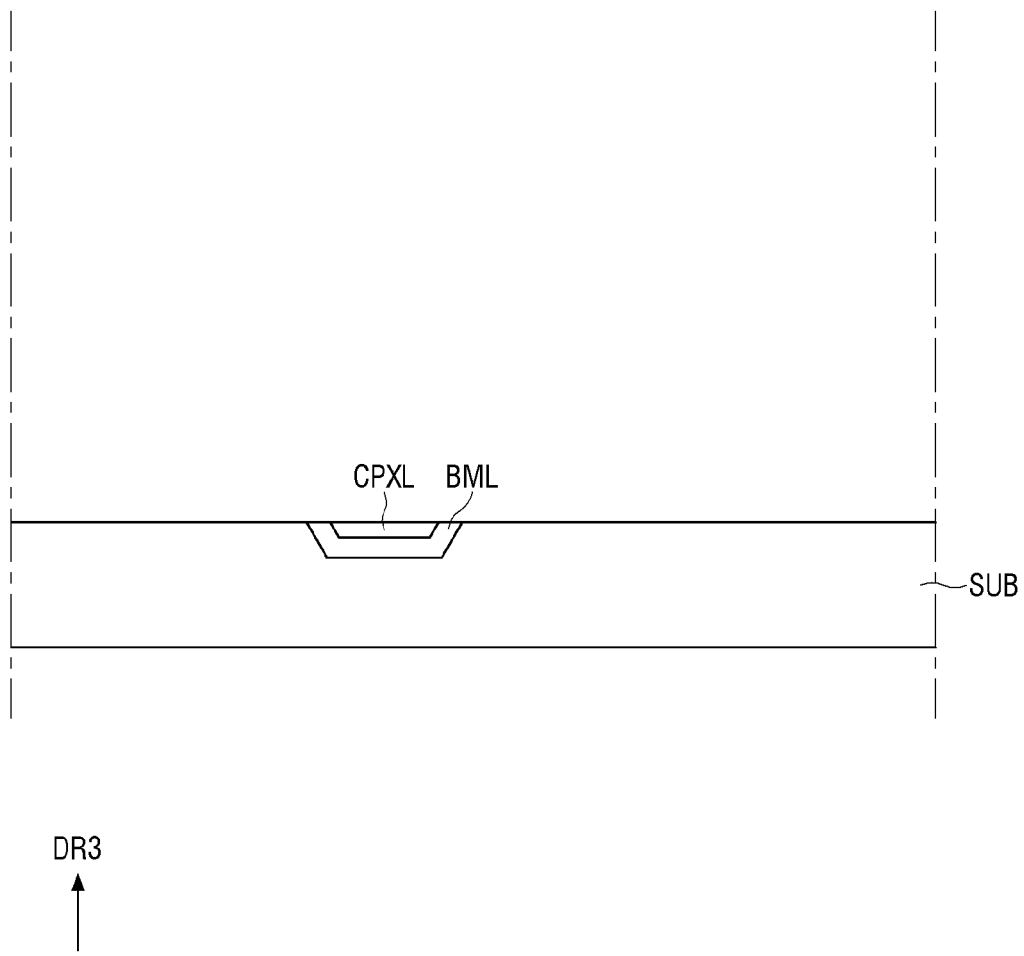

Thereafter, referring to FIGS. 11 and 12, the lower metal layer BML is formed by etching the lower metal material layer BML' (S500). The lower metal material layer BML' may be etched by dry etching, but the disclosure is not limited thereto.

The lower metal material layer BML' may be etched by dry etching using a second etching gas. The second etching gas may be an argon (Ar) gas and may not react with the organic-inorganic composite layer CPXL. Accordingly, part of the lower metal material layer BML' not covered by the organic-inorganic composite layer CPXL may be etched by the second etching gas, and part of the lower metal material layer BML' covered by the organic-inorganic composite layer CPXL may not be etched because the organic-inorganic composite layer CPXL functions as an etching stopper.

FIGS. 10 through 12 illustrate an embodiment in which the organic-inorganic composite material layer CPXL' and the lower metal material layer BML' are etched by different etching gases from each other, but the disclosure is not limited thereto. Alternatively, the organic-inorganic composite material layer CPXL' and the lower metal material layer BML' may both be etched at the same time by the same etching gas, i.e., a third etching gas. In such an embodiment, the organic-inorganic composite material layer CPXL' and the lower metal material layer BML' may have a same etching ratio with respect to the third etching gas.

Figure 13:
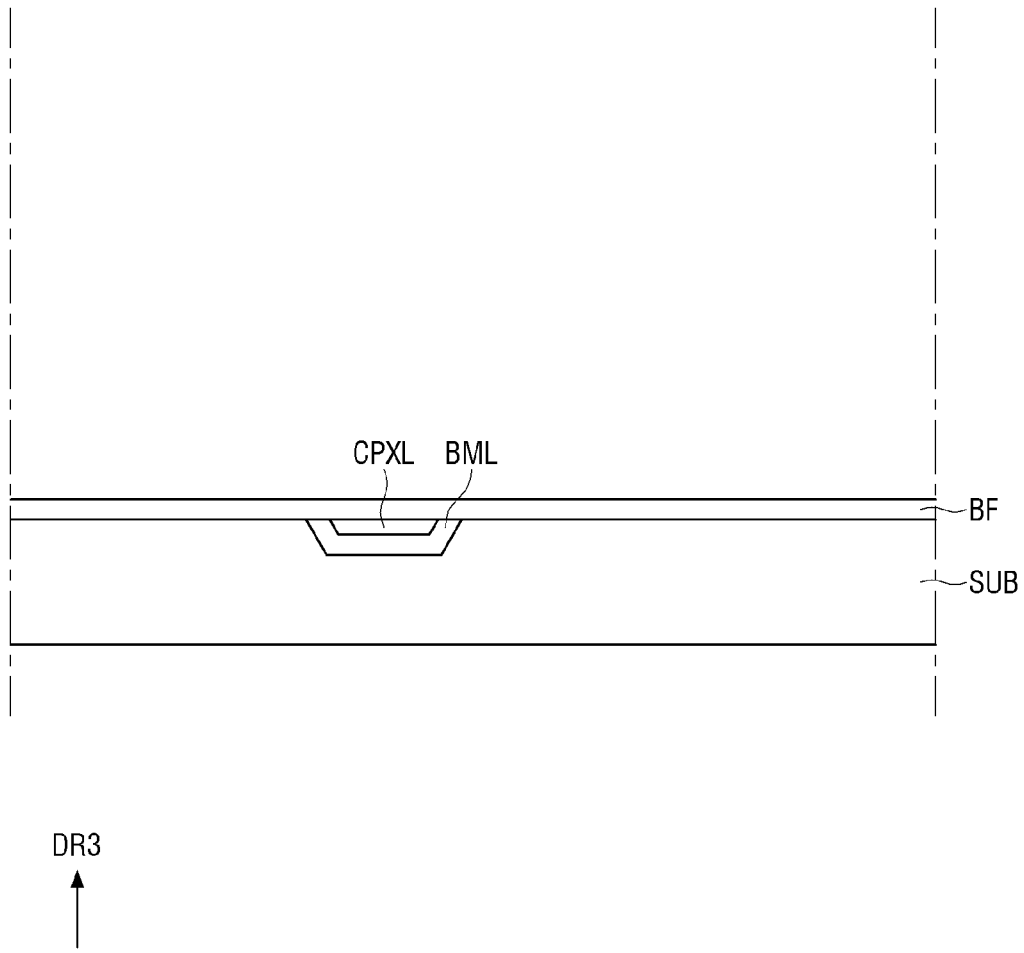

Thereafter, referring to FIG. 13, the buffer layer BF is formed on the lower metal layer BML, the organic-inorganic composite layer CPXL, and the substrate SUB (S600). In an embodiment, as described above, the flat area SUBa of the substrate SUB, an exposed surface BMLa of the lower metal layer BML, and a top surface CPXLa of the organic-inorganic composite layer CPXL may be disposed on substantially a same plane as each other, and thus, the buffer layer BF may be formed to be substantially and almost flat without step differences thereon.

Thereafter, subsequent processes for forming a semiconductor layer ACT, a gate insulating layer GI, and the like are performed, thereby obtaining the display device 10.

Display devices according to alternative embodiments of the disclosure will hereinafter be described, focusing mainly on the differences with embodiments of the display device 10 described above. Like reference numerals indicate like elements throughout the disclosure, and thus, any repetitive detailed descriptions thereof will be omitted.

Figure 14:
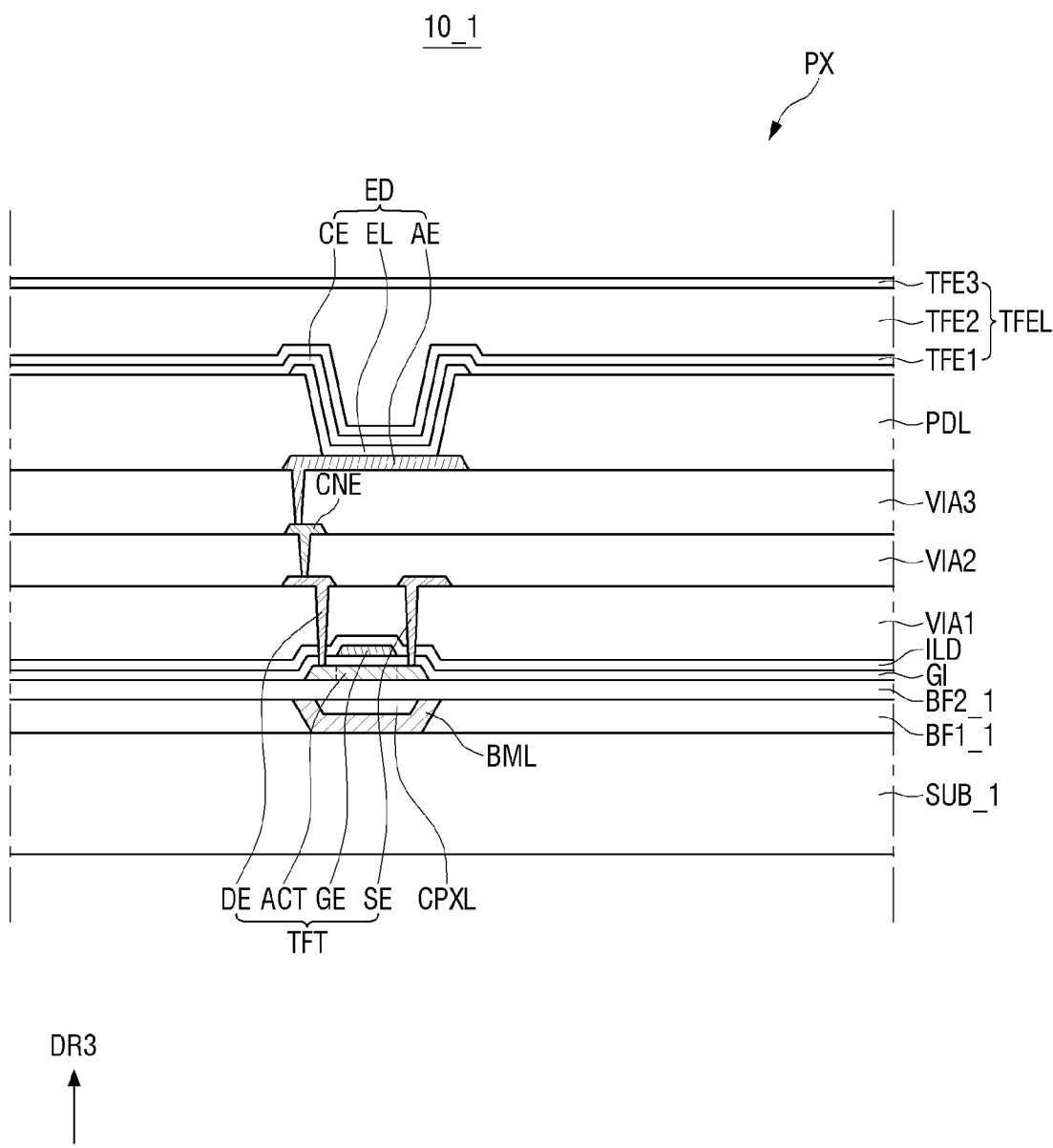
FIG. 14 is a cross-sectional view of a pixel of a display device according to an alternative embodiment of the disclosure.

FIG. 14 is a cross-sectional view of a pixel of a display device according to an alternative embodiment of the disclosure.

Referring to FIG. 14, in an embodiment of a display device 10_1, a lower metal layer BML may be disposed on a trench area defined or formed in a first buffer layer BF1_1, which is disposed on a substrate SUB_1 as an insulating layer.

The substrate SUB_1 may generally have a flat surface. In such an embodiment, no recess may be formed in the substrate SUB_1.

The first buffer layer BF1_1 and a second buffer layer BF2_1 may be sequentially disposed on the substrate SUB_1.

The first buffer layer BF1_1 may be disposed on the substrate SUB_1 to form a flat area and the trench area. The trench area may be an area depressed or recessed from the flat area. In some embodiments, the trench area of the first buffer layer BF1_1 may be defined by an opening formed through the first buffer layer BF1_1, but the disclosure is not limited thereto. Alternatively, the trench area of the first buffer layer BF1_1 may not penetrate the first buffer layer BF1_1. FIG. 14 illustrates an embodiment where the trench area of the first buffer layer BF1_1 is defined by a removed portion of the first buffer layer BF1_1. As the trench area is formed on the first buffer layer BF1_1, the fabrication of the display device 10_1 can be further facilitated.

The lower metal layer BML may be bent along the profile of the trench area of the first buffer layer BF1_1 to form a dent portion, which accommodates an organic-inorganic composite layer CPXL. The lower metal layer BML, the first buffer layer BF1_1, and the organic-inorganic composite layer CPXL may provide a flat surface together.

The second buffer layer BF2_1 may be disposed on the first buffer layer BF1_1 and may have a flat profile. The second buffer layer BF2_1 may electrically insulate the lower metal layer BML and a thin-film transistor TFT.

Each of the first and second buffer layers BF1_1 and BF2_1 may include an inorganic film capable of preventing the infiltration of the air or moisture. In an embodiment, for example, each of the first and second buffer layers BF1_1 and BF2_1 may include a plurality of inorganic films that are alternately stacked.

Figure 15:
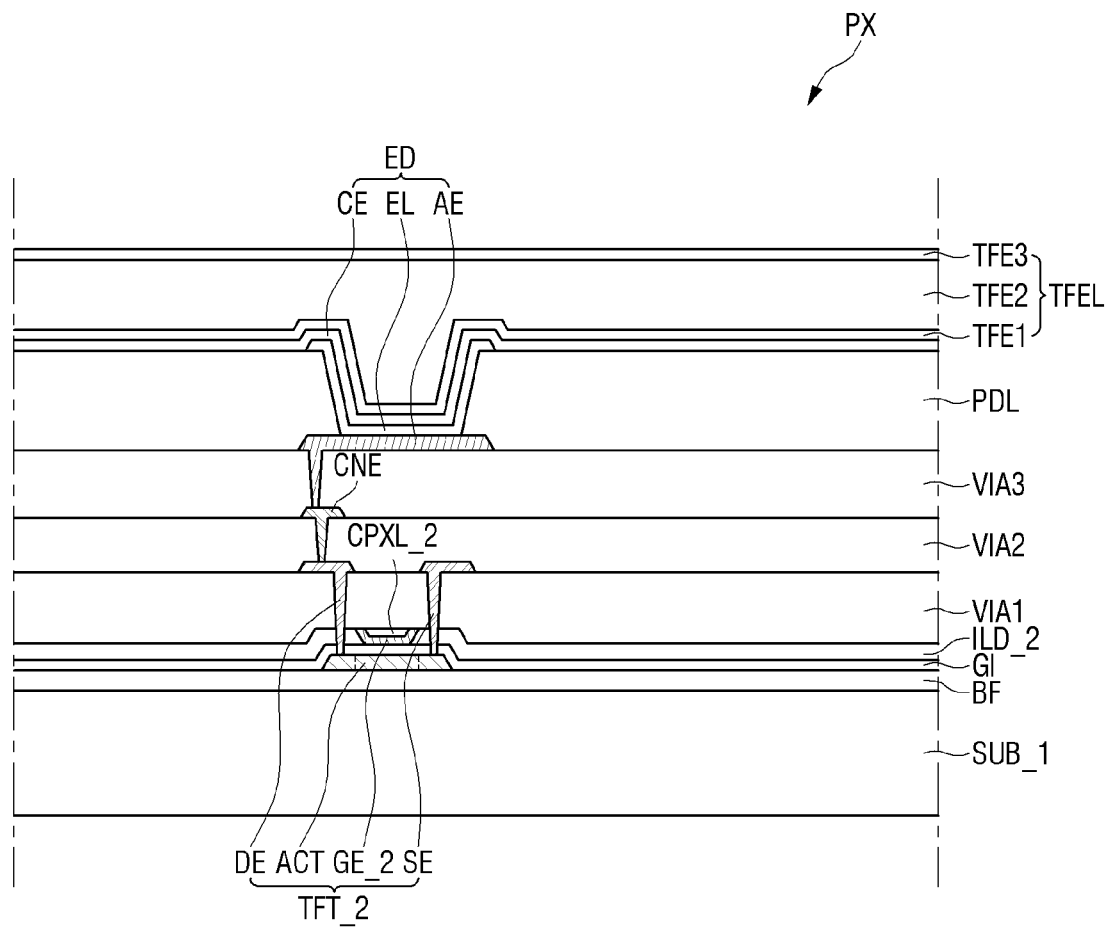
FIG. 15 is a cross-sectional view of a pixel of a display device according to another alternative embodiment of the disclosure.

FIG. 15 is a cross-sectional view of a pixel of a display device according to another alternative embodiment of the disclosure.

Referring to FIG. 15, in an embodiment of a display device 10_2, a gate electrode GE_2 of a thin-film transistor TFT_2 may be bent to form a dent portion, and an organic-inorganic composite layer CPXL_2 may be disposed in the dent portion to fill the dent portion.

In an embodiment, for example, an interlayer insulating layer ILD_2 may form a trench area in an area overlapping a semiconductor layer ACT, and the gate electrode GE_2 of the thin-film transistor TFT_2 may be bent along the profile of the trench area of the interlayer insulating layer ILD_2 to form a dent portion where the organic-inorganic composite layer CPXL_2 is formed. In such an embodiment, a capacitor electrode may be disposed on the organic-inorganic composite layer CPXL_2.

The organic-inorganic composite layer CPXL_2 is substantially the same as the organic-inorganic composite layer CPXL of the display device 10, and thus, any repetitive detailed description thereof will be omitted.

In some embodiments, a substrate SUB_1 may generally have a flat profile, but the disclosure is not limited thereto. Alternatively, a trench area may be formed on the substrate SUB_1, like in the substrate SUB of the display device 10, and a lower metal layer may be additionally disposed on the trench area of the substrate SUB_1.

Figure 16:
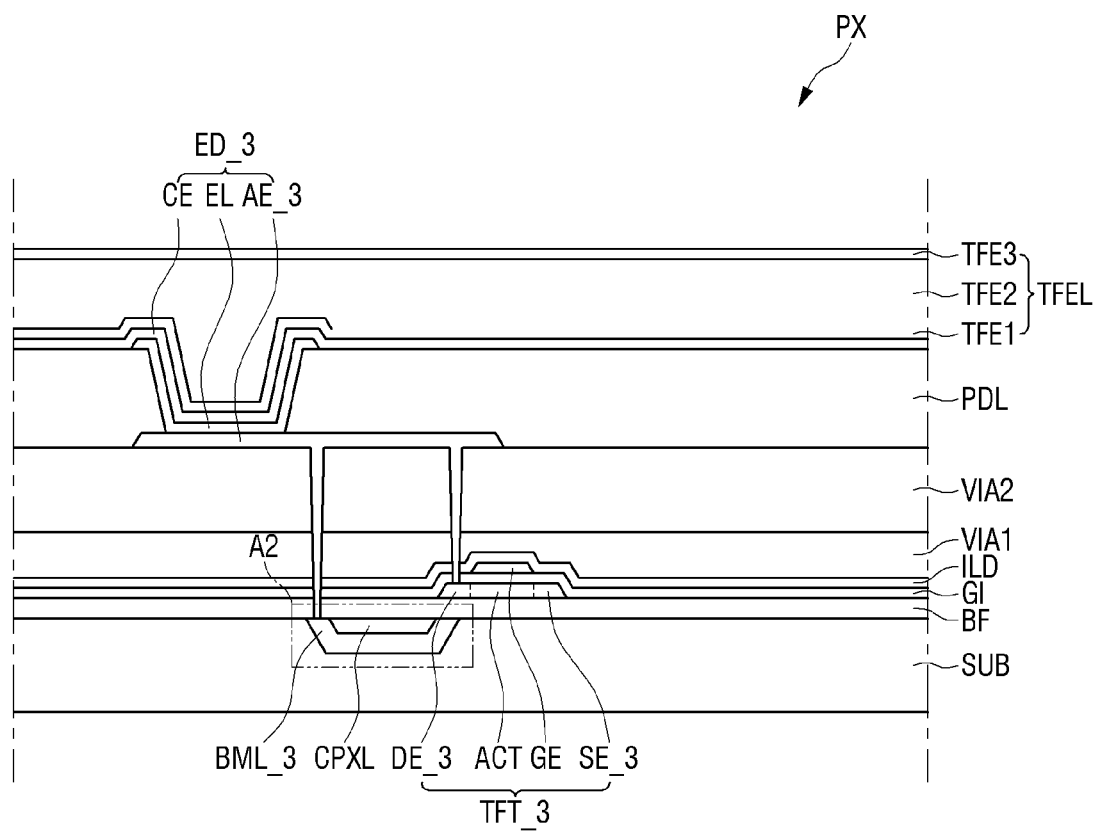
FIG. 16 is a cross-sectional view of a pixel of a display device according to another alternative embodiment of the disclosure.
Figure 17:
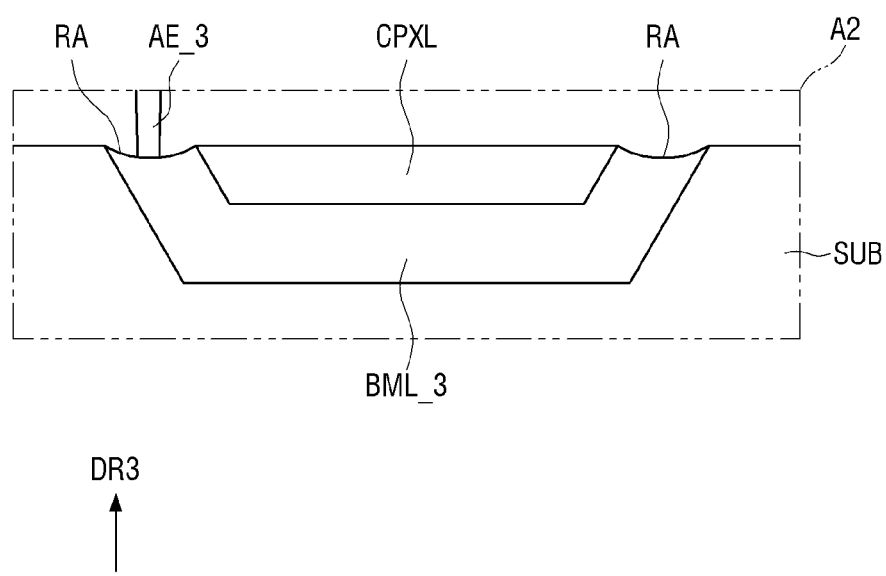
FIG. 17 is an enlarged cross-sectional view of an area A2 of FIG. 16.

FIG. 16 is a cross-sectional view of a pixel of a display device according to another alternative embodiment of the disclosure. FIG. 17 is an enlarged cross-sectional view of an area A2 of FIG. 16.

Referring to FIGS. 16 and 17, in an embodiment of a display device 10_3, a lower metal layer BML_3, which is an electrode pattern disposed in a trench area of a substrate SUB, may be electrically connected to a pixel electrode AE_3.

A thin-film transistor TFT_3 may be disposed on a buffer layer BF and may form a pixel circuit of a pixel PX. In an embodiment, for example, the thin-film transistor TFT_3 may be a driving transistor or a switching transistor. The thin-film transistor TFT_3 may include a semiconductor layer ACT, a source electrode SE_3, a drain electrode DE_3, and a gate electrode GE.

The semiconductor layer ACT may be disposed on the buffer layer BF. The semiconductor layer ACT may overlap the gate electrode GE in a thickness direction and may be insulated from the gate electrode GE by a gate insulating layer GI. Parts of the semiconductor layer ACT may be transformed into conductors and may thus form the source and drain electrodes SE_3 and DE_3. In such an embodiment, the semiconductor layer ACT may include an oxide semiconductor such as indium tin oxide (ITO) or indium gallium zinc oxide (IGZO).

A light-emitting element ED_3 may be disposed on a second via insulating layer VIA2. The third via insulating layer VIA3 of the display device 10 may not be provided, but the disclosure is not limited thereto. FIG. 16 illustrates an embodiment where the third via insulating layer VIA3 of the display device 10 is not provided in the display device 10_3.

The pixel electrode AE_3 of the light-emitting element ED_3 may be electrically connected to the drain electrode DE_3 of the thin-film transistor TFT_3 through a contact hole defined through a first via insulating layer VIA1 and the second via insulating layer VIA2.

in such an embodiment, the pixel electrode AE_3 may be electrically connected to a lower metal layer BML_3, which is disposed on the trench area of the substrate SUB, through a contact hole defined through the second via insulating layer VIA2, the first via insulating layer VIAL an interlayer insulating layer ILD, and a gate insulating layer GI. In an embodiment, for example, the pixel electrode AE_3 may be electrically connected to an exposed surface RA of the lower metal layer BML_3, exposed by the substrate and an organic-inorganic composite layer CPXL, through the contact hole defined through the second via insulating layer VIA2, the first via insulating layer VIA1, the interlayer insulating layer ILD, and the gate insulating layer GI.

In some embodiments, the lower metal layer BML_3 may be formed as a single layer or a multilayer, each layer therein including Mo, Al, Cr, Au, Ti, Ni, Nd, Cu, or an alloy thereof, but the disclosure is not limited thereto. For convenience, the lower metal layer BML_3 will hereinafter be described as including Cu.

The exposed surface RA of the lower metal layer BML_3 may be curved. In an embodiment, for example, the exposed surface RA may be concave in the opposite direction of a third direction DR3 because of how the lower metal layer BML_3 is formed.

It will hereinafter be described a process of forming the lower metal layer BML_3 of the display device 10_3 of FIG. 16.

Figure 18:
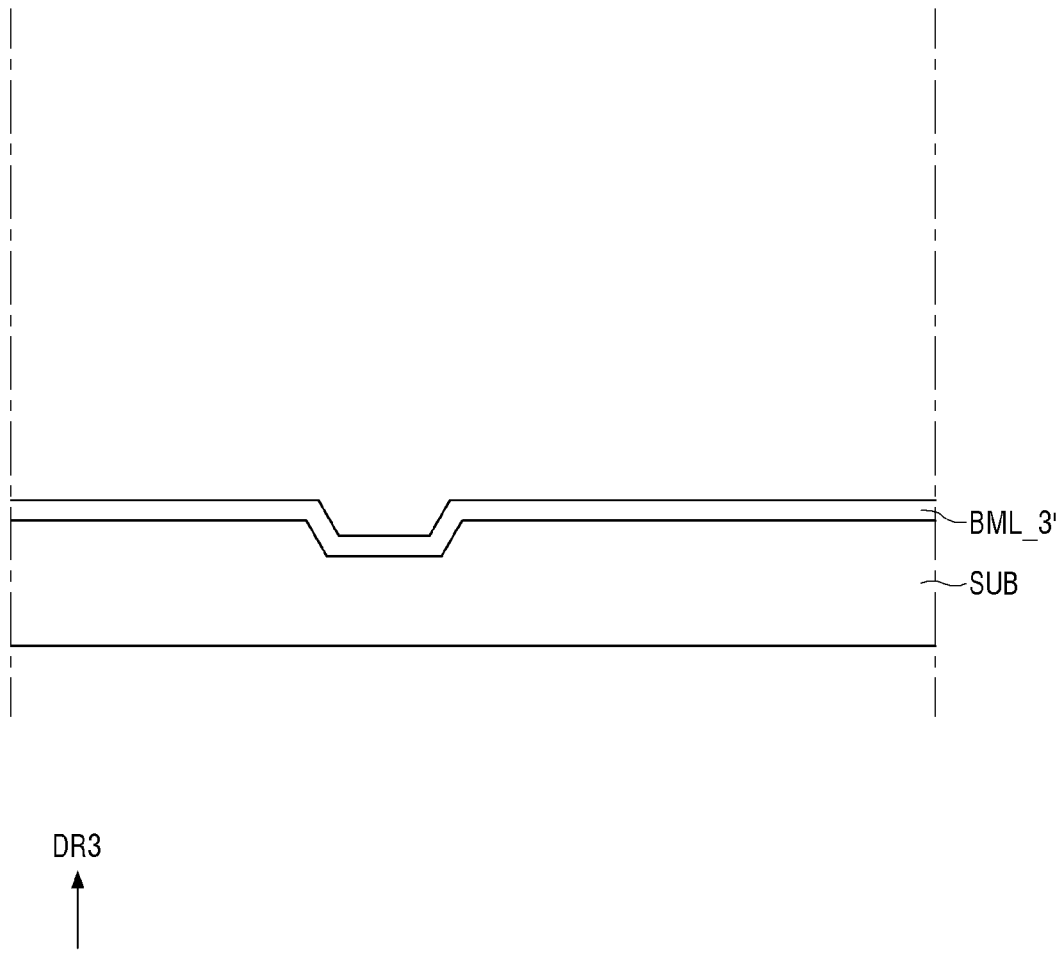
FIGS. 18 through 20 are cross-sectional views illustrating a method of manufacturing the display device of FIG. 16.
Figure 19:
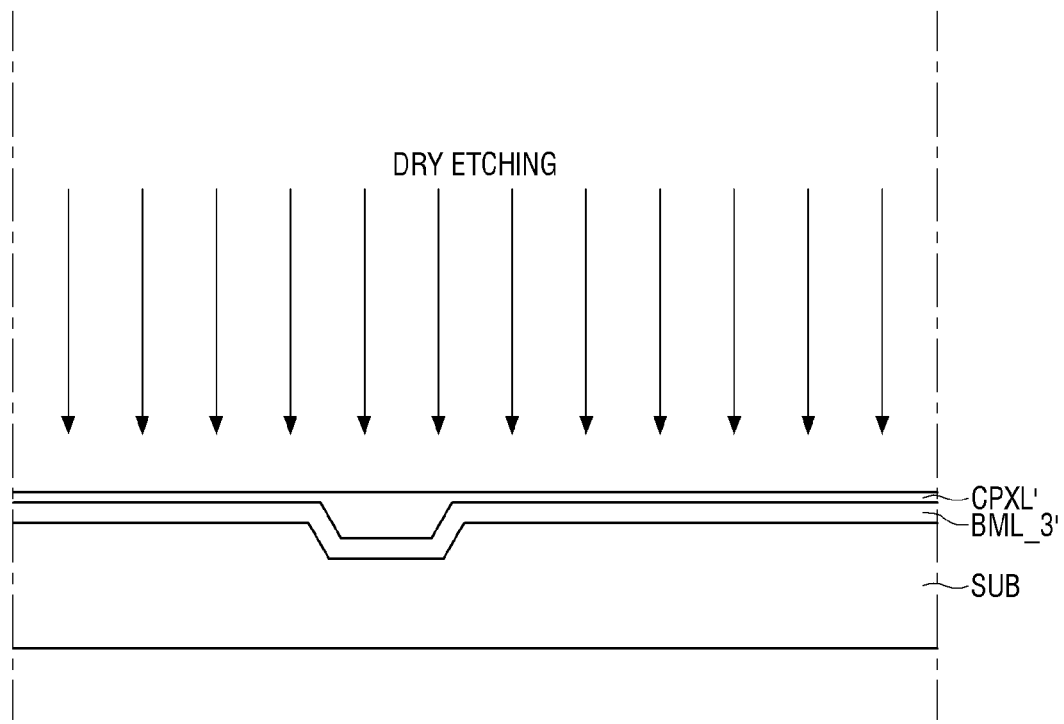
Figure 20:
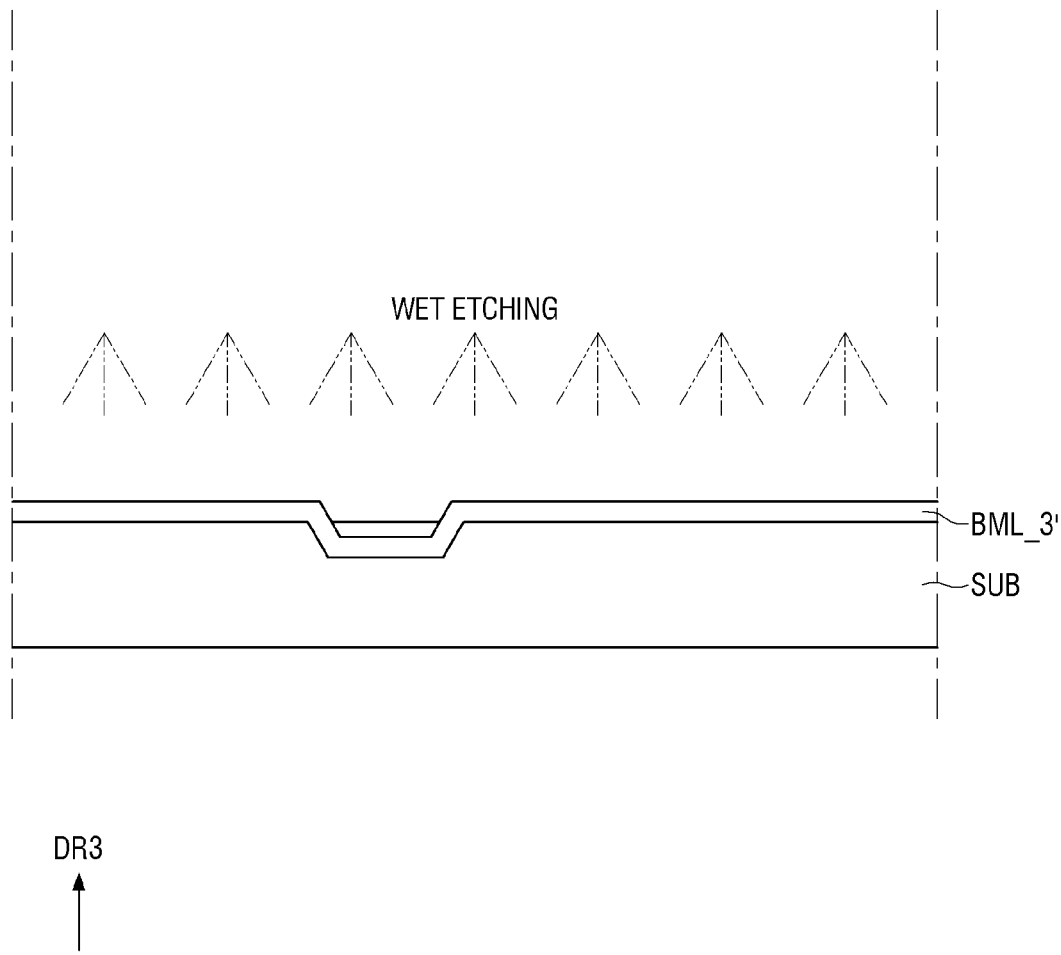

FIGS. 18 through 20 are cross-sectional views illustrating a method of manufacturing the display device of FIG. 16.

Referring to FIGS. 18 through 20, a lower metal material layer BML_3' and an organic-inorganic composite material layer CPXL' are formed on the substrate SUB where the trench area is formed, the organic-inorganic composite layer CPXL is formed by etching the organic-inorganic composite material layer CPXL', and the lower metal layer BML_3 is formed by etching the lower metal material layer BML_3'.

In an embodiment where the lower metal layer BML_3 includes Cu, the lower metal layer BML_3 may not be formed by dry etching. Thus, the lower metal layer BML_3 may be formed by wet etching using an etchant. In such an embodiment, as the lower metal layer BML_3 is etched by wet etching, the exposed surface RA of the lower metal layer BML_3 may be curved. In an embodiment, for example, the exposed surface RA may be concave in the opposite direction of the third direction DR3. The organic-inorganic composite layer CPXL may function as an etching stopper and may thus prevent part of the lower metal layer BML_3 covered by the organic-inorganic composite layer CPXL from being etched.

Figure 21:
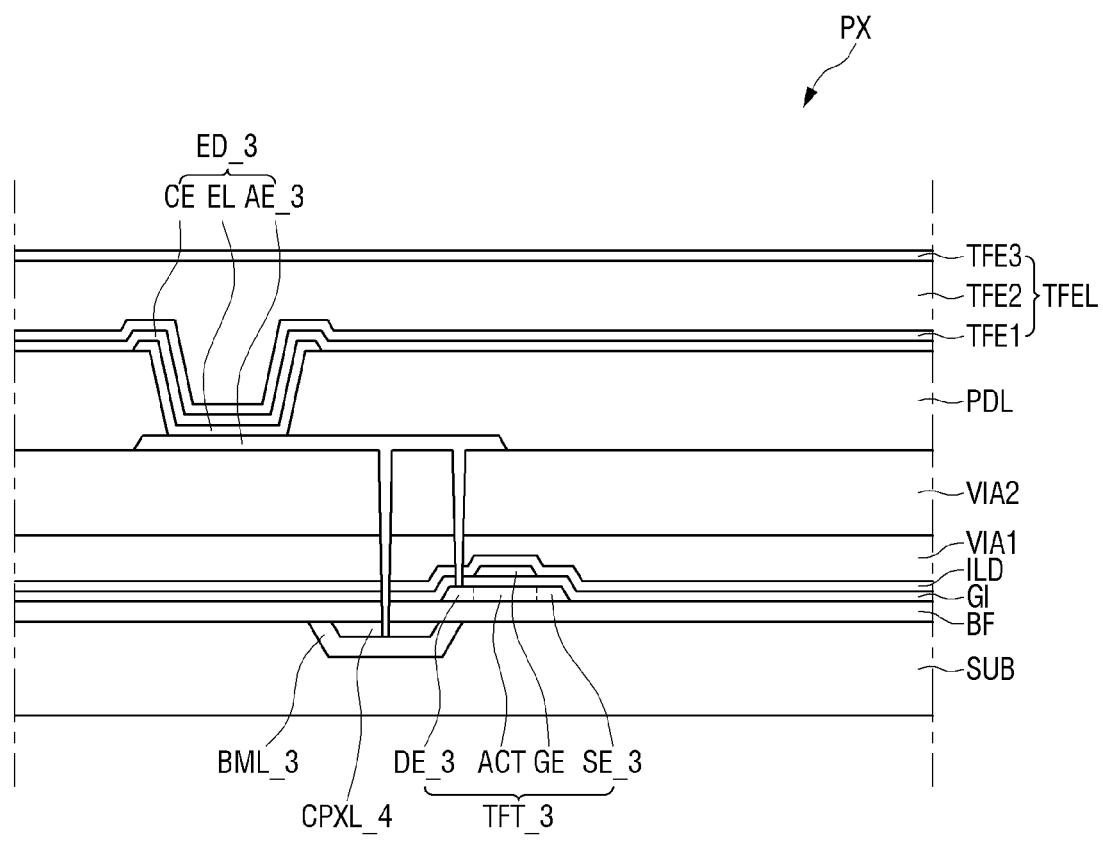
FIG. 21 is a cross-sectional view of a pixel of a display device according to another alternative embodiment of the disclosure.

FIG. 21 is a cross-sectional view of a pixel of a display device according to another alternative embodiment of the disclosure.

The display device 10_4 shown in FIG. 21 is substantially the same as the display device 10_3 of FIGS. 16 and 17 except that a pixel electrode AE_3 is electrically connected to a lower metal layer BML_3 through an organic-inorganic composite layer CPXL_4.

In an embodiment, for example, the pixel electrode AE_3 may be electrically connected to the lower metal layer BML_3 through a contact hole defined through a second via insulating layer VIA2, a first via insulating layer VIA1, an interlayer insulating layer ILD, a gate insulating layer GI, and an organic-inorganic composite layer CPXL_4.

In such an embodiment, the pixel electrode AE_3 may be electrically connected to part of the lower metal layer BML_3 that remains unetched by overlapping with the organic-inorganic composite layer CPXL_4, rather than to an exposed surface of the lower metal layer BML_3. Thus, the lower metal layer BML_3 and the pixel electrode AE_3 may be electrically connected over a relatively large area.

Figure 22:
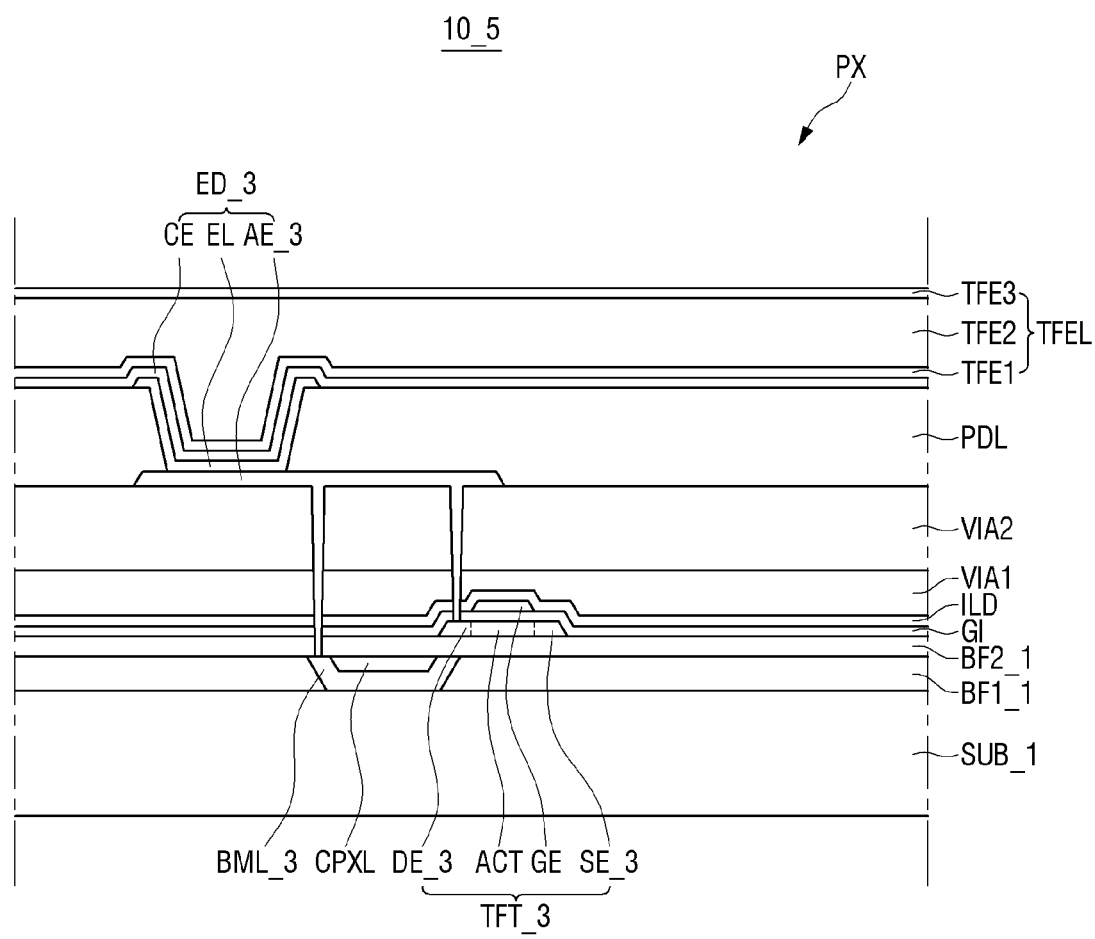
FIG. 22 is a cross-sectional view of a pixel of a display device according to another alternative embodiment of the disclosure.

FIG. 22 is a cross-sectional view of a pixel of a display device according to another alternative embodiment of the disclosure.

The display device 10_5 shown in FIG. 22 is substantially the same as the display device 10_3 of FIGS. 16 and 17 except that a lower metal layer BML_3 is disposed on a trench area formed by a first buffer layer BF1_1.

A substrate SUB_1 may generally have a flat surface. In such an embodiment, no recess may be formed in the substrate SUB_1.

The first buffer layer BF1_1 and a second buffer layer BF2_1 may be sequentially disposed on the substrate SUB_1. The first buffer layer BF1_1 and a second buffer layer BF2_1 are the same as those of FIG. 14, and thus, any repetitive detailed descriptions thereof will be omitted.

Figure 23:
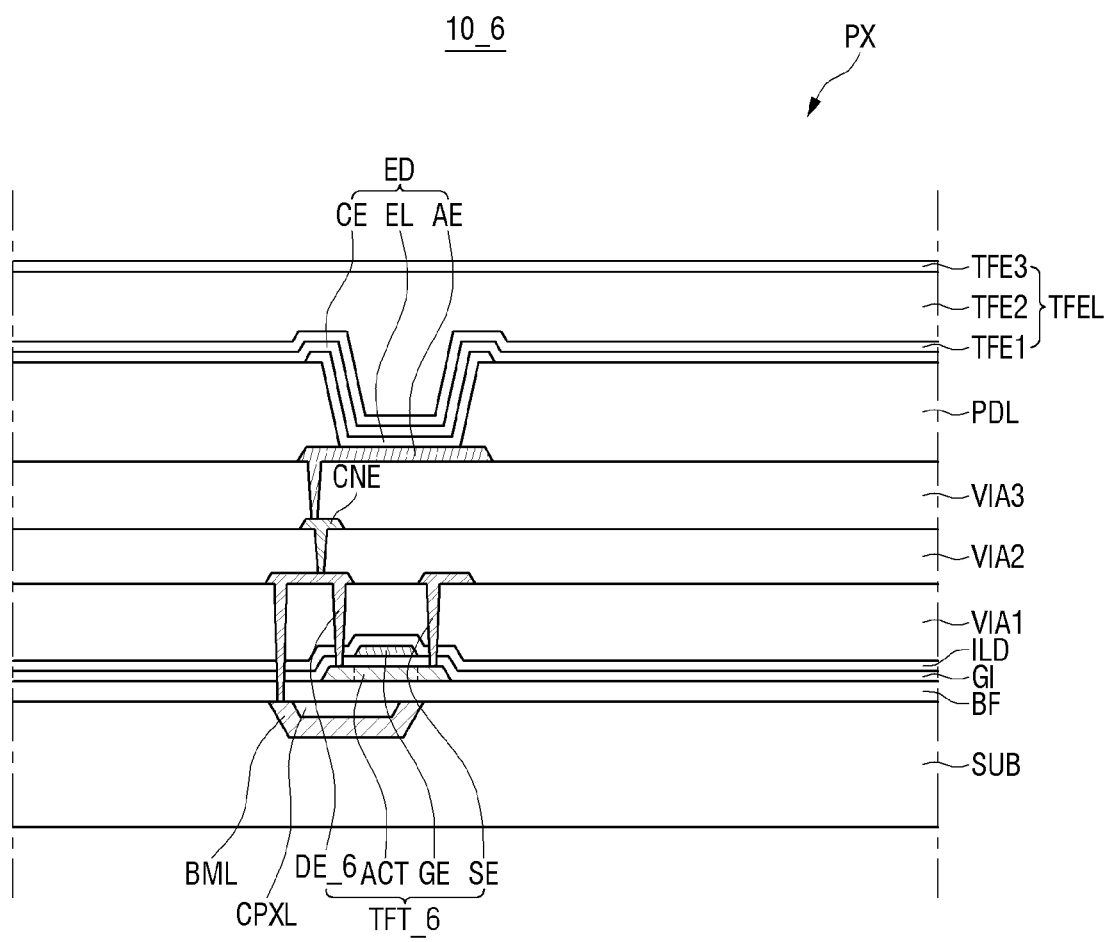
FIG. 23 is a cross-sectional view of a pixel of a display device according to another alternative embodiment of the disclosure.

FIG. 23 is a cross-sectional view of a pixel of a display device according to another alternative embodiment of the disclosure.

The display device 10_6 shown in FIG. 23 is substantially the same as the display device 10 of FIG. 4 except that a drain electrode DE_6 of a thin-film transistor TFT_6 electrically connects a semiconductor layer ACT and a lower metal layer BML.

FIG. 23 illustrates an embodiment where the drain electrode DE_6 electrically connects the semiconductor layer ACT and the lower metal layer BML to each other, but the disclosure is not limited thereto. Alternatively, a source electrode SE may electrically connect the semiconductor layer ACT and the lower metal layer BML.

FIG. 23 illustrates an embodiment where a gate insulating layer GI covers the semiconductor layer ACT and a buffer layer BF, but the disclosure is not limited thereto. Alternatively, the gate insulating layer GI may be formed to have substantially the same profile as a gate electrode GE disposed thereon. In such an embodiment, the gate insulating layer GI and the gate electrode GE may be etched together during the formation of the gate electrode GE and may thus have substantially a same profile, exposing part of the semiconductor layer ACT.

Figure 24:
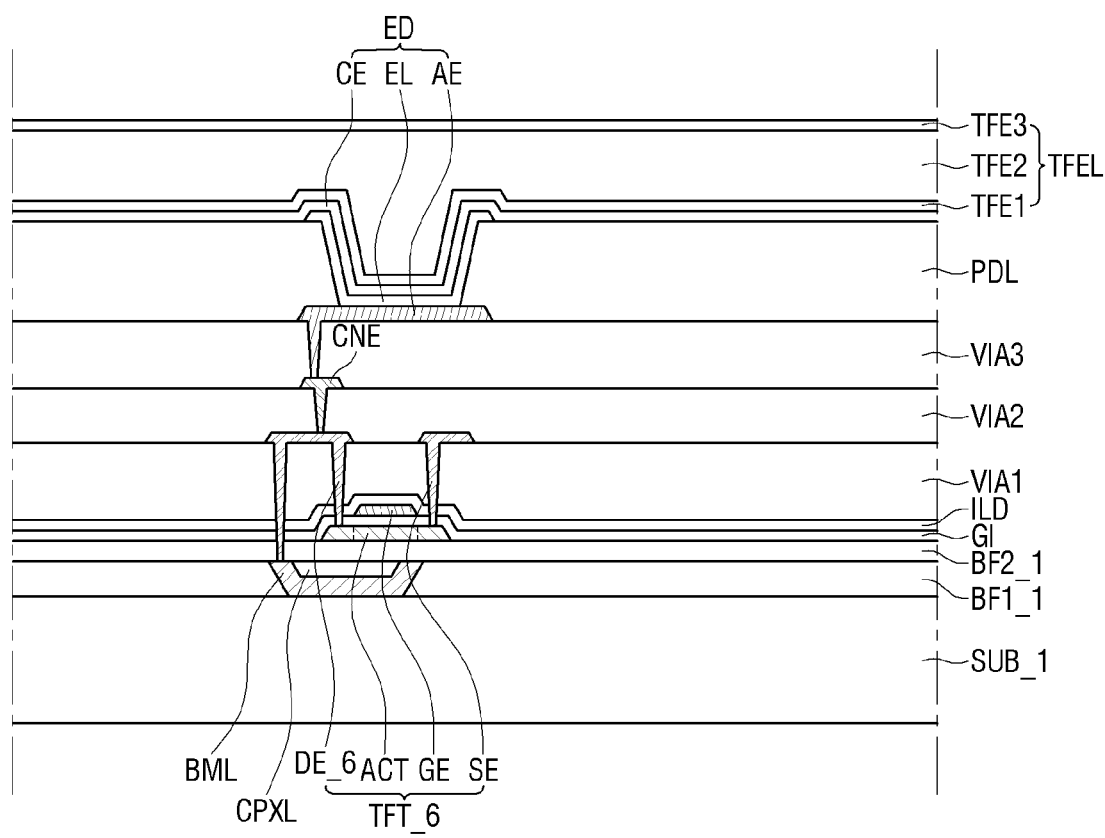
FIG. 24 is a cross-sectional view of a pixel of a display device according to another alternative embodiment of the disclosure.

FIG. 24 is a cross-sectional view of a pixel of a display device according to another alternative embodiment of the disclosure.

The display device 10_7 shown in FIG. 24 is substantially the same as the display device 10_6 of FIG. 23 except that a lower metal layer BML is disposed on a trench area formed by a first buffer layer BF1_1.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
    a substrate including a flat area and a trench area, which is recessed from the flat area;
    an electrode pattern disposed on the substrate, wherein the electrode pattern includes a dent portion, which is bent along a profile of the trench area of the substrate;
    a planarization layer inserted in the dent portion;
    a first insulating layer covering the substrate, the electrode pattern, and the planarization layer; and
    a light-emitting element disposed on the first insulating layer,
    wherein the planarization layer includes an organic-inorganic composite material.

2. The display device of claim 1, wherein
    the organic-inorganic composite material includes an organic material and an inorganic material, and
    a content of the inorganic material is greater than a content of the organic material.

3. The display device of claim 2, wherein
    the organic material includes siloxane, and
    the inorganic material includes silicon oxide ($SiO_2$).

4. The display device of claim 1, wherein
    the electrode pattern includes an exposed surface exposed by the flat area of the substrate and the planarization layer, and
    a top surface of the flat area, the exposed surface, and a top surface of the planarization layer are disposed on a same plane.

5. The display device of claim 4, further comprising:
    a thin-film transistor disposed between the first insulating layer and the light-emitting element,
    wherein a semiconductor layer of the thin-film transistor overlaps with the electrode pattern.

6. The display device of claim 4, wherein
    the light-emitting element includes a first electrode, a light-emitting layer, which is disposed on the first electrode, and a second electrode, which is disposed on the light-emitting layer,
    the display device further comprises a thin-film transistor disposed between the first insulating layer and the light-emitting element, and
    the first electrode of the light-emitting element and the thin-film transistor are electrically connected to each other.

7. The display device of claim 6, wherein the first electrode is in direct contact with the exposed surface of the electrode pattern through a contact hole defined through the first insulating layer.

8. The display device of claim 6, wherein the first electrode is in direct contact with the electrode pattern through a contact hole defined through the first insulating layer and the planarization layer.

9. The display device of claim 1, wherein
    the electrode pattern includes an exposed surface exposed by the flat area of the substrate and the planarization layer, and
    the exposed surface is curved.

10. The display device of claim 9, wherein the electrode pattern includes copper (Cu).

11. A display device comprising:
    a first insulating layer disposed on a substrate, wherein the first insulating layer includes a flat area and a trench area, which is recessed from the flat area;
    an electrode pattern disposed on the substrate, wherein the electrode pattern includes a dent portion, which is bent along a profile of the trench area;
    a planarization layer inserted in the dent portion;
    a second insulating layer covering the substrate, the electrode pattern, and the planarization layer; and
    a light-emitting element disposed on the second insulating layer,
    wherein the planarization layer includes an organic-inorganic composite material.

12. The display device of claim 11, wherein
    the organic-inorganic composite material includes an organic material and an inorganic material, and
    a content of the inorganic material is greater than a content of the organic material.

13. The display device of claim 12, wherein
    the organic material includes siloxane, and
    the inorganic material includes silicon oxide ($SiO_2$).

14. The display device of claim 11, wherein
    the electrode pattern includes an exposed surface exposed by the flat area of the substrate and the planarization layer, and
    a top surface of the flat area, the exposed surface and a top surface of the planarization layer are disposed on a same plane.

15. The display device of claim 14, further comprising:
    a thin-film transistor disposed between the first insulating layer and the light-emitting element,
    wherein a semiconductor layer of the thin-film transistor overlaps the electrode pattern.

16. The display device of claim 14, wherein
    the light-emitting element includes a first electrode, a light-emitting layer, which is disposed on the first electrode, and a second electrode, which is disposed on the light-emitting layer,
    the display device further comprises a thin-film transistor disposed between the first insulating layer and the light-emitting element, and
    the first electrode of the light-emitting element and the thin-film transistor are electrically connected to each other.

17. The display device of claim 14, further comprising:
    a thin-film transistor disposed between the substrate and the light-emitting element,
    wherein the electrode pattern is a gate electrode of the thin-film transistor.

18. A method of manufacturing a display device, the method comprising:
    preparing a substrate;
    forming a flat area and a trench area, which is recessed from the flat area, on the substrate;

forming an electrode material layer, which is bent in part along a profile of the trench area, on the substrate;

forming an organic-inorganic composite material layer on the electrode material layer;

forming a planarization layer, which is disposed on a part of the electrode material layer, by etching the organic-inorganic composite material layer;

forming an electrode layer by selectively etching a part of the electrode material layer not covered by the planarization layer; and forming a first insulating layer on the flat area of the substrate, the planarization layer, and the electrode layer.

19. The method of claim 18, wherein each of the organic-inorganic composite material layer and the organic-inorganic composite layer includes an organic material and an inorganic material, and a content of the inorganic material is greater than a content of the organic material.

20. The method of claim 19, wherein the organic material includes siloxane, and the inorganic material includes silicon oxide ($SiO_2$).

* * * * *